(12) United States Patent
Kim et al.

(10) Patent No.: US 11,941,187 B2
(45) Date of Patent: Mar. 26, 2024

(54) ELECTRONIC PEN AND INTERFACE DEVICE INCLUDING THE SAME

(71) Applicant: SAMSUNG DISPLAY CO., LTD., Yongin-si (KR)

(72) Inventors: Chul Kim, Hwaseong-si (KR); Yun-Ho Kim, Hwaseong-si (KR); Jaeuk Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/064,963

(22) Filed: Dec. 13, 2022

(65) Prior Publication Data

US 2023/0113603 A1    Apr. 13, 2023

Related U.S. Application Data

(63) Continuation of application No. 17/507,954, filed on Oct. 22, 2021, now Pat. No. 11,556,188.

(30) Foreign Application Priority Data

Feb. 19, 2021    (KR) ......................... 10-2021-0022402

(51) Int. Cl.
| | | |
|---|---|---|
| G06F 3/046 | (2006.01) | |
| G06F 3/0354 | (2013.01) | |
| G06F 3/038 | (2013.01) | |
| G06F 3/041 | (2006.01) | |
| G06F 3/044 | (2006.01) | |
| H03H 7/00 | (2006.01) | |

(52) U.S. Cl.
CPC ........ *G06F 3/03545* (2013.01); *G06F 3/0383* (2013.01); *G06F 3/0416* (2013.01); *G06F 3/0446* (2019.05); *G06F 3/046* (2013.01); *G06F 2203/0384* (2013.01); *H03H 7/00* (2013.01)

(58) Field of Classification Search
CPC .. G06F 3/03545; G06F 3/0446; G06F 3/0383; G06F 3/0416; G06F 3/046; G06F 2203/0384; H03H 7/00
See application file for complete search history.

(56) References Cited

U.S. PATENT DOCUMENTS

| | | |
|---|---|---|
| 5,792,997 A | 8/1998 | Fukuzaki |
| 10,768,723 B2 | 9/2020 | Katsurahira et al. |
| | (Continued) | |

FOREIGN PATENT DOCUMENTS

| | | |
|---|---|---|
| EP | 3340019 | 6/2018 |
| KR | 10-2017-0132754 | 12/2017 |
| | (Continued) | |

OTHER PUBLICATIONS

Office Action dated May 19, 2022 in corresponding U.S. Appl. No. 17/507,954.

*Primary Examiner* — Lisa S Landis
(74) *Attorney, Agent, or Firm* — F. Chau & Associates, LLC

(57) ABSTRACT

An electronic pen includes a signal generator, a power supply, and a resonance circuit. The signal generator is configured to generate a signal. The power supply is configured to supply power to the signal generator. The resonance circuit is configured to generate a current based on the signal and emit a magnetic field based on the current.

18 Claims, 26 Drawing Sheets

(56) References Cited

U.S. PATENT DOCUMENTS

| | | | | |
|---|---|---|---|---|
| 2007/0146351 A1* | 6/2007 | Katsurahira | ........ | G06F 3/04166 345/179 |
| 2016/0246390 A1 | 8/2016 | Lukanc et al. | | |
| 2017/0277284 A1* | 9/2017 | Kim | .................... | G06F 3/03545 |
| 2017/0285772 A1 | 10/2017 | Yamamoto | | |
| 2017/0371435 A1* | 12/2017 | Yamada | .............. | G06F 3/03542 |
| 2018/0164909 A1* | 6/2018 | Bae | .................... | G06F 3/04162 |
| 2022/0269358 A1 | 8/2022 | Kim et al. | | |

FOREIGN PATENT DOCUMENTS

| | | |
|---|---|---|
| KR | 10-2020-0044672 | 4/2020 |
| KR | 10-2201466 | 1/2021 |

* cited by examiner

ELECTRONIC PEN AND INTERFACE DEVICE INCLUDING THE SAME

CROSS-REFERENCE TO RELATED APPLICATIONS

This U.S. non-provisional patent application is a continuation application of U.S. patent application Ser. No. 17/507,954 filed Oct. 22, 2021, which claims priority under 35 U.S.C. § 119 to Korean Patent Application No. 10-2021-0022402, filed on Feb. 19, 2021, the disclosures of which are incorporated by reference in their entirety herein.

1. DISCUSSION OF RELATED ART

The present disclosure relates to an electronic pen and an interface device including the same.

2. TECHNICAL FIELD

Multimedia electronic devices such as televisions, mobile phones, tablets, computers, navigation systems, and game machines include a display panel for displaying images. These electronic devices can receive input from a keyboard and a mouse. However, there is an increasing demand for electronic devices that are capable of receiving input from an electronic pen that allows a user to easily and intuitively input information or commands.

SUMMARY

At least one embodiment of the present disclosure relates to an electronic pen with increased performance and an interface device including the same.

An embodiment of the inventive concept provides an electronic pen including: a signal generator, a power supply, and a resonance circuit. The signal generator is configured to generate a signal. The power supply is configured to supply power to the signal generator. The resonance circuit is configured to generate a current based on the signal and emit a magnetic field based on the current.

In an embodiment, the electronic pen furthers include a signal detector for detecting an external magnetic field provided from the outside of the electronic pen and controlling the transmission of the signal according to whether the external magnetic field is detected.

In an embodiment, when the external magnetic field is detected, the resonance circuit operates as a passive type charged by the external magnetic field.

In an embodiment, when the external magnetic field is not detected, the resonance circuit operates as an active type charged by a signal provided by the signal generator.

In an embodiment, the electronic pen further includes: a pen tip; and a pressure detector electrically connected to the resonance circuit and configured to detect a physical pressure applied to the pen tip, wherein the pen pressure detector includes a variable capacitor.

In an embodiment, a frequency of the signal generated by the signal generator has a predetermined value, wherein a resonance frequency of an output signal outputted from the resonance circuit changes according to the detected pressure.

In an embodiment, the signal generator includes a specific application integrated circuit or oscillator.

In an embodiment, the signal generator includes a wireless communication module for wirelessly communicating with an external device.

In an embodiment, the signal includes a beacon signal and a data packet, wherein the data packet includes at least one of tilt information, pressure information, and button information.

In an embodiment, the power supply includes a battery or a high-capacity capacitor.

In an embodiment, the resonance circuit includes a capacitor that stores the current as an electric field, and an inductor that stores the as a magnetic field.

In an embodiment of the inventive concept, an interface device includes: an electronic device and an electronic pen. The electronic device includes a display layer, a sensor layer disposed on the display layer, and a touch driving chip for driving the sensor layer. The electronic pen is configured to emit a magnetic field. The electronic pen includes a signal generator configured to generate a signal, a power supply configured to supply power to the signal generator, and a resonance circuit configured to generate a current based on the signal and emit the magnetic field based on the current.

In an embodiment, the sensor layer includes a plurality of electrodes and a plurality of cross electrodes, wherein the touch driving chip detects an input by a user's touch based on a change in mutual capacitance between the plurality of electrodes and the plurality of cross electrodes, and detects an input by the electronic pen using the plurality of electrodes or the plurality of cross electrodes.

In an embodiment, the electronic pen further includes a signal detector for detecting an external magnetic field provided from the outside of the electronic pen and controlling the transmission of the signal according to whether the external magnetic field is detected.

In an embodiment, the electronic device further includes a digitizer disposed under the display layer for generating the external magnetic field, wherein the electronic pen does not generate the signal when the external magnetic field is detected.

In an embodiment, the electronic pen further includes a pen tip, and a pressure detector electrically connected to the resonance circuit for detecting a physical pressure applied to the pen tip, wherein a frequency of the signal generated by the signal generator has a predetermined value, wherein a resonance frequency of the output signal outputted from the resonance circuit is changed according to the detected pressure.

In an embodiment, the signal generator includes a wireless communication module capable for communicating with the display device, wherein the signal includes a beacon signal and a data packet, wherein the data packet includes at least one of tilt information, pressure information, and button information.

In an embodiment of the inventive concept, an electronic pen includes: a housing, a signal generator, a power supply, a resonance circuit, and a pen time. The signal generator is disposed inside the housing and configured to generate a signal. The power supply is disposed inside the housing and configured to supply power to the signal generator. The resonance circuit is configured to generate a magnetic field based on the signal. The pen tip is disposed in an end portion of the housing.

In an embodiment, the electronic pen further includes a signal detector for detecting an external magnetic field provided from the outside of the electronic pen, wherein when the external magnetic field is detected, the signal generator does not generate the signal, and when the external magnetic field is not detected, the signal generator generates the signal.

In an embodiment, the electronic pen further includes a pressure detector electrically connected to the resonance circuit and configured to detect a physical pressure applied to the pen tip, wherein a frequency of the signal generated by the signal generator is a predetermined frequency, wherein a resonance frequency of an output signal outputted from the resonance circuit is changed according to the detected pressure.

In an embodiment of the inventive concept, an interface device includes an electronic device and an electronic pen. The electronic device includes a display layer, a sensor layer disposed on the display layer, and a touch driving chip for driving the sensor layer. The electronic pen is configured to emit a magnetic field. A current is induced in an electrode of the sensor layer by the magnetic field when the electronic pen approaches the sensor layer. The touch driving chip is configured to determine an orientation of the electronic pen based on a shape of a profile of voltage values of the electrodes.

In an embodiment, the orientation of the electronic pen is not tilted when a left side and a right side of the profile with respect to a center point of the electronic pen have a symmetrical shape.

In an embodiment, the orientation of the electronic pen is tilted when a left side and a right side of the profile with respect to a center point of the electronic pen have different shapes.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
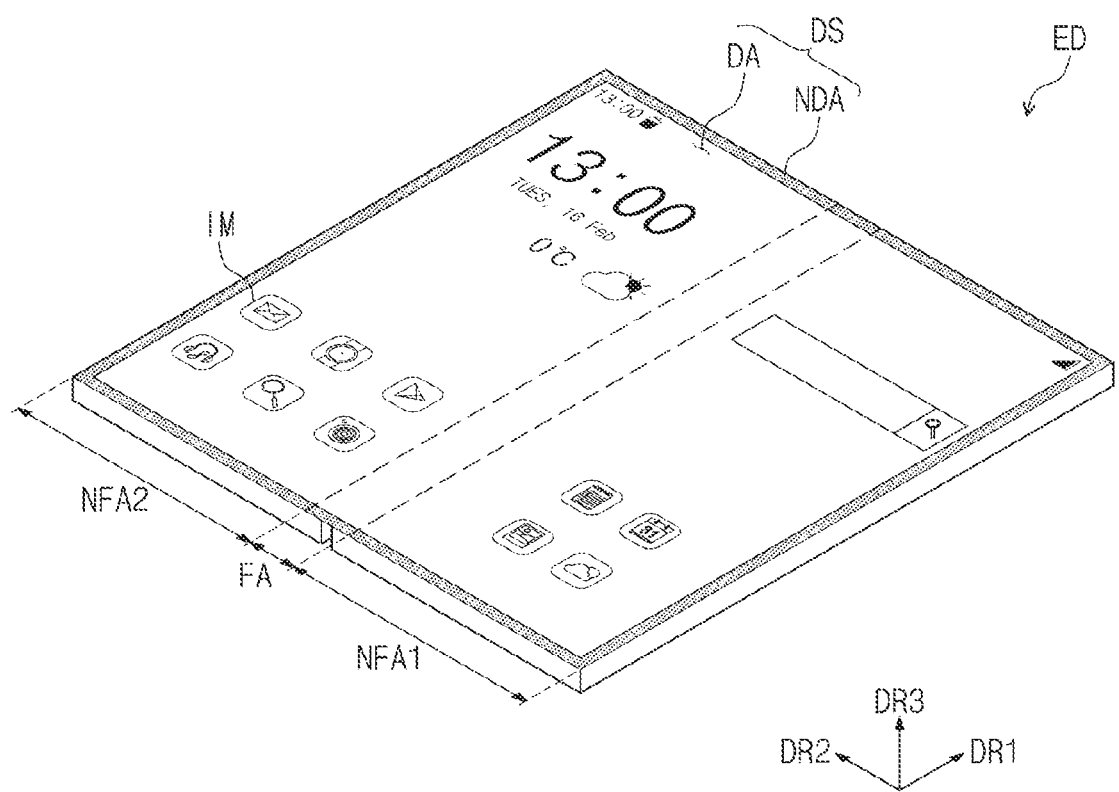
FIGS. 1A and 1B are perspective views of an electronic device according to an embodiment of the inventive concept.

In this specification, when an element (or region, layer, part, etc.) is referred to as being "on", "connected to", or "coupled to" another element, it means that it may be directly placed on/connected to/coupled to other components, or a third component may be arranged between them.

Like reference numerals refer to like elements. Additionally, in the drawings, the thicknesses, proportions, and dimensions of components may be exaggerated for effective description. Further, "and/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of components shown in the drawing. The terms are described as a relative concept based on a direction shown in the drawing.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

The terms "part" and "unit" mean a software component or a hardware component that performs a specific function. The hardware component may include, for example, a field-programmable gate array (FPGA) or an application-specific integrated circuit (ASIC). A software component may refer to executable code and/or data used by executable code in an addressable storage medium. Thus, software components may be, for example, object-oriented software components, class components and working components, and may include processes, functions, properties, procedures, subroutines, program code segments, drivers, firmwares, microcodes, circuits, data, databases, data structures, tables, arrays, or variables.

Hereinafter, embodiments of the inventive concept will be described with reference to the drawings.

Figure 1B:
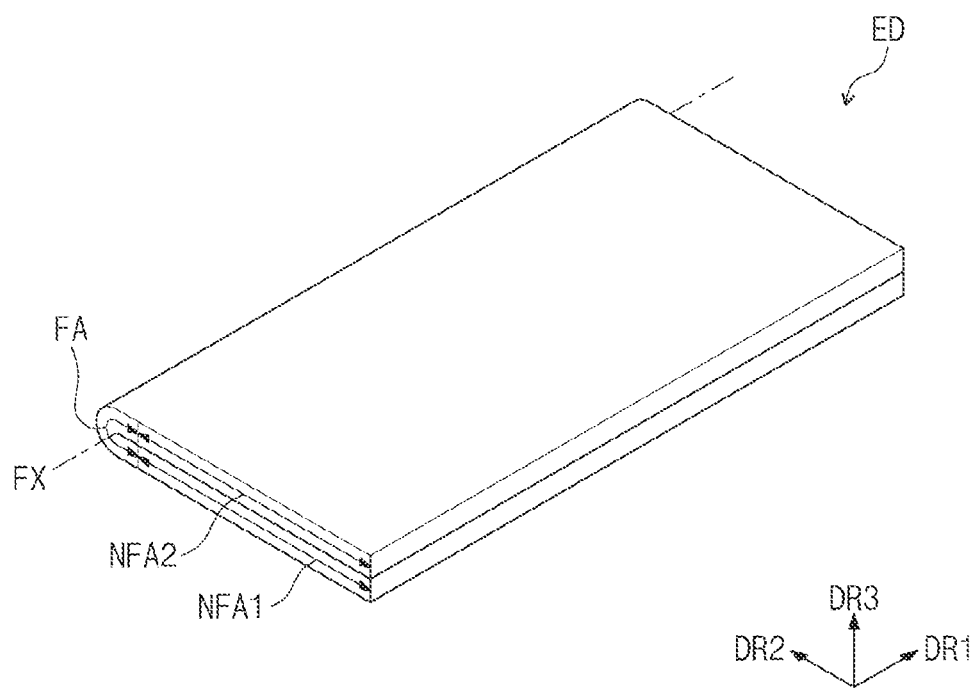

FIGS. 1A and 1B are perspective views of an electronic device ED according to an embodiment of the inventive concept. FIG. 1A illustrates an unfolded state of the electronic device ED, and FIG. 1B illustrates a folded state of the electronic device ED.

Referring to FIGS. 1A and 1B, an electronic device ED may be a device activated according to an electrical signal. For example, the electronic device ED may be a mobile phone, a foldable mobile phone, a tablet, a car navigation system, a game machine, or a wearable device, but is not limited thereto. While FIGS. 1A and 1B exemplarily illustrate that the electronic device ED is a foldable mobile phone, the inventive concept is not particularly limited thereto.

The electronic device ED according to an embodiment of the inventive concept includes a display surface DS defined by a first direction DR1 and a second direction DR2 crossing the first direction DR1. The electronic device ED may provide the image IM to the user through the display surface DS.

The display surface DS may include a display area DA and a non-display area NDA around the display area DA. The display area DA displays the image IM, and the non-display area NDA does not display the image IM. The non-display area NDA may surround the display area DA. However, the inventive concept is not limited thereto, and the shape of the display area DA and the shape of the non-display area NDA may be modified.

Hereinafter, the direction substantially perpendicular to the plane defined by the first direction DR1 and the second direction DR2 is defined as the third direction DR3. In addition, in the present specification, "on the plane" may be defined as a state viewed from the third direction DR3.

The electronic device ED may include a folding area FA (or, foldable area) and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The first non-folding area NFA1, the folding area FA, and the second non-folding area NFA2 may be sequentially defined in the electronic device ED along the second direction DR2.

As illustrated in FIG. 1B, the folding area FA may be folded based on a folding axis FX parallel to the first direction DR1. The folding area FA may extend along the first direction DR1. The folding area FA may be folded to have a predetermined curvature and a radius of curvature. The first non-folding area NFA1 and the second non-folding area NFA2 face each other in the folded state, and the electronic device ED may be inner-folded so that the display surface DS is not exposed to the outside.

In an embodiment of the inventive concept, the electronic device ED may be outer-folded so that the display surface DS is exposed to the outside. In an embodiment of the inventive concept, the electronic device ED may be configured such that an inner-folding or an outer-folding operation is repeated from an unfolding operation to each other, but is not limited thereto. In an embodiment of the inventive concept, the electronic device ED may be configured to select one of an unfolding operation, an inner-folding operation, and an outer-folding operation.

Figure 2:
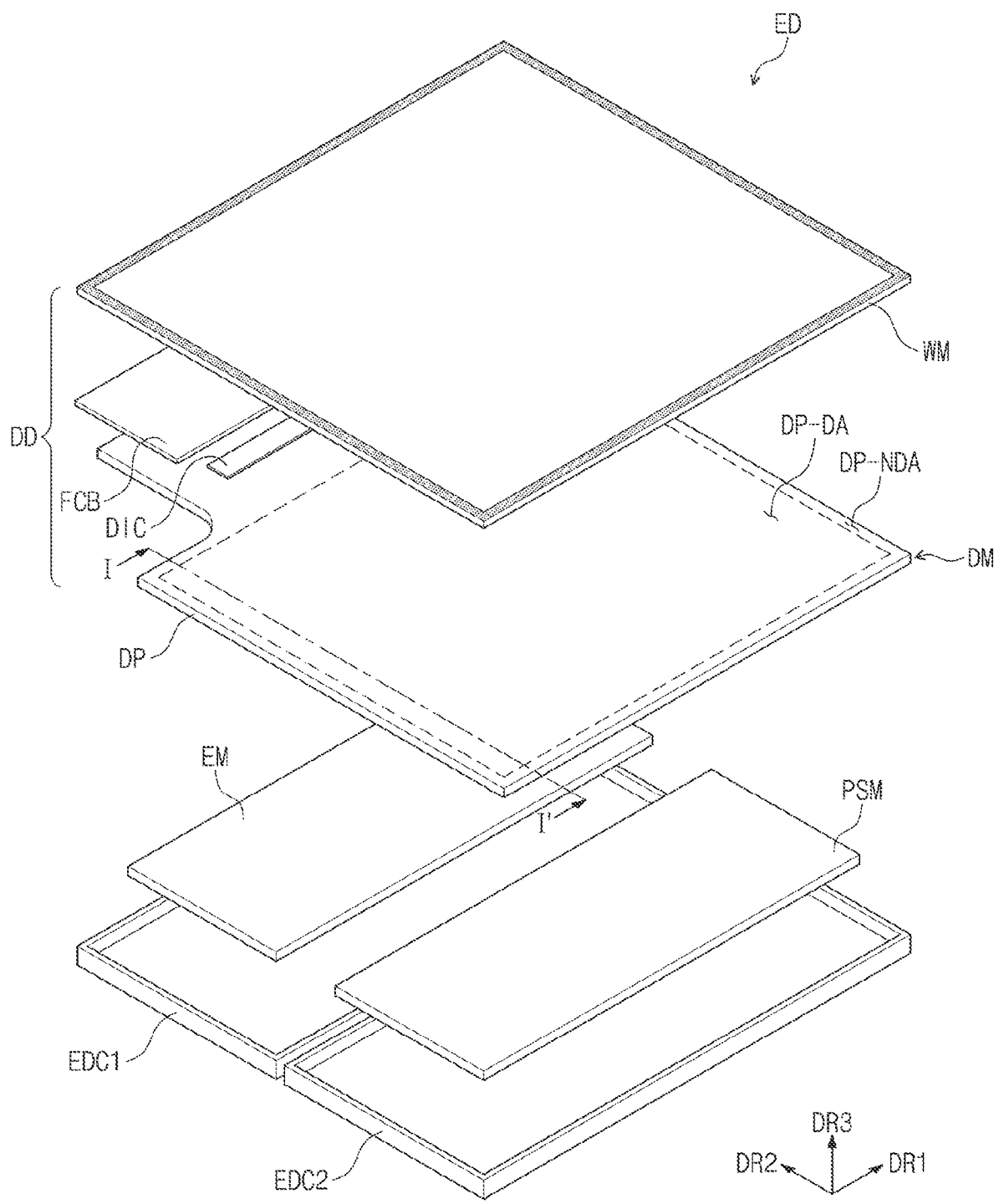
FIG. 2 is an exploded perspective view of an electronic device according to an embodiment of the inventive concept.

FIG. 2 is an exploded perspective view of an electronic device according to an embodiment of the inventive concept.

Referring to FIG. 2, the electronic device ED may include a display device DD, an electronic module EM, a power module PSM, and cases EDC1 and EDC2. Although not shown in the drawing separately, the electronic device ED may further include a mechanical structure for controlling the folding operation of the display device DD.

The display device DD generates an image and detects an external input. The display device DD includes a window module WM and a display module DM. The window module WM provides the front surface of the electronic device ED. The window module WM may be a translucent or transparent material such as glass or plastic.

The display module DM may include at least the display panel DP. In FIG. 2, the display module DM is illustrated as being the same as the display panel DP, but the display module DM may be a laminate structure in which a plurality of components are stacked. A detailed description of the stacked structure of the display module DM will be described below.

The display panel DP includes a display area DP-DA and a non-display area DP-NDA corresponding to the display area DA (see FIG. 1A) and the non-display area NDA (see FIG. 1A) of the electronic device ED. In the present specification, "the region/part and the region/part correspond" means overlapping and is not limited to the same area. The display module DM may include a driving chip DIC disposed on the non-display area DP-NDA. The display module DM may further include a flexible circuit film FCB coupled to the non-display area DP-NDA.

The driving chip DIC may include driving elements for driving pixels of the display panel DP, for example, a data driving circuit. FIG. 2 illustrates a structure in which the driving chip DIC is mounted on the display panel DP, but the inventive concept is not limited thereto. For example, the driving chip DIC may be mounted on the flexible circuit film FCB.

The electronic module EM may include a main driver (e.g., a driver or control circuit). The electronic module EM may include at least one of a wireless communication module, a camera module, a proximity sensor module, an image input module, an audio input module, an audio output module, a memory, and an external interface module. The electronic module EM is electrically connected to the power module PSM.

The main driver (or main controller) controls the overall operation of the electronic device ED. For example, the main driver activates or deactivates the display device DD according to a user input. The main driver may control the operation of the display device DD and other modules. The main driver may include at least one microprocessor.

The cases EDC1 and EDC2 accommodate the display module DM, the electronic module EM, and the power module PSM. Although two cases EDC1 and EDC2 separated from each other are illustrated as an example, the inventive concept is not limited thereto. Although not shown, the electronic device ED may further include a hinge structure for connecting the two cases EDC1 and EDC2. The cases EDC1 and EDC2 may be combined with the window module WM. The cases EDC1 and EDC2 protect components accommodated in the cases EDC1 and EDC2, such as the display module DM, the electronic module EM, and the power module PSM.

Figure 3A:
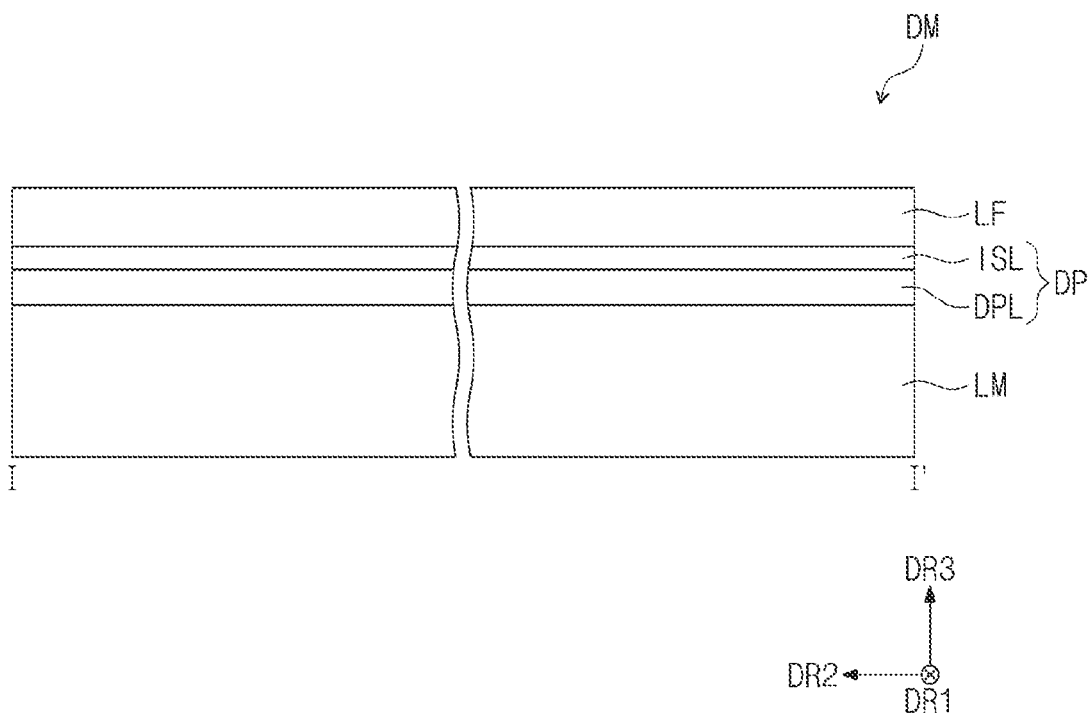
FIG. 3A is a cross-sectional view of a display module according to an embodiment of the inventive concept.

FIG. 3A is a cross-sectional view of a display module according to an embodiment of the inventive concept.

Referring to FIG. 3A, the display module DM may include a display panel DP, an optical film LF disposed on the display panel DP, and a lower member LM disposed under the display panel DP. The display panel DP may include a display layer DPL and a sensor layer ISL disposed on the display layer DPL. An adhesive layer may be disposed between the members as needed. The display panel DP may be disposed on the lower member LM.

The display layer DPL may be a component that is substantially responsible for generating an image. The display layer DPL may be a light emitting display layer. For example, the display layer DPL may be an organic light emitting display layer, a quantum dot display layer, a micro light-emitting-diode (LED) display layer, or a nano LED display layer.

The sensor layer ISL may be disposed on the display layer DPL. The sensor layer ISL may detect an external input applied from the outside. The sensor layer ISL may be an external sensor attached to the display layer DPL, and the sensor layer ISL may be an integrated sensor continuously formed during the manufacturing process of the display layer DPL.

In an embodiment, the optical film LF reduces reflectance of light incident from the outside. The optical film LF may include a phase retarder and/or a polarizer. The optical film LF may include at least a polarizing film. The phase retarder may be a waveplate. The phase retarder may be an optical device that resolves a light wave into two orthogonal linear polarization components and produces a phase shift between them. The polarizer may be an optical filter that lets light waves of a specific polarization pass through while blocking light waves of other polarizations.

Alternatively, the optical film LF may include color filters. The color filters may have a predetermined arrangement. The arrangement of color filters may be determined in consideration of the emission colors of the pixels PX included in the display layer DPL. In addition, the optical film LF may further include a black matrix adjacent to the color filters. The black matrix may include a material that absorbs light.

Alternatively, the optical film LF may include a destructive interference structure. For example, the destructive interference structure may include a first reflective layer and a second reflective layer disposed on different layers. First reflected light reflected from the first reflective layer and second reflected light reflected from the second reflective layer may be destructively interfered, and thus reflectance of external light may be reduced.

The lower member LM may include various functional members or layers. For example, the lower member LM may include at least one of a light shielding layer for blocking light incident on the display layer DPL, a shock absorbing layer for absorbing external shocks, a support layer for supporting the display layer DPL, and a heat dissipation layer for dissipating heat generated in the display layer DPL.

Figure 3B:
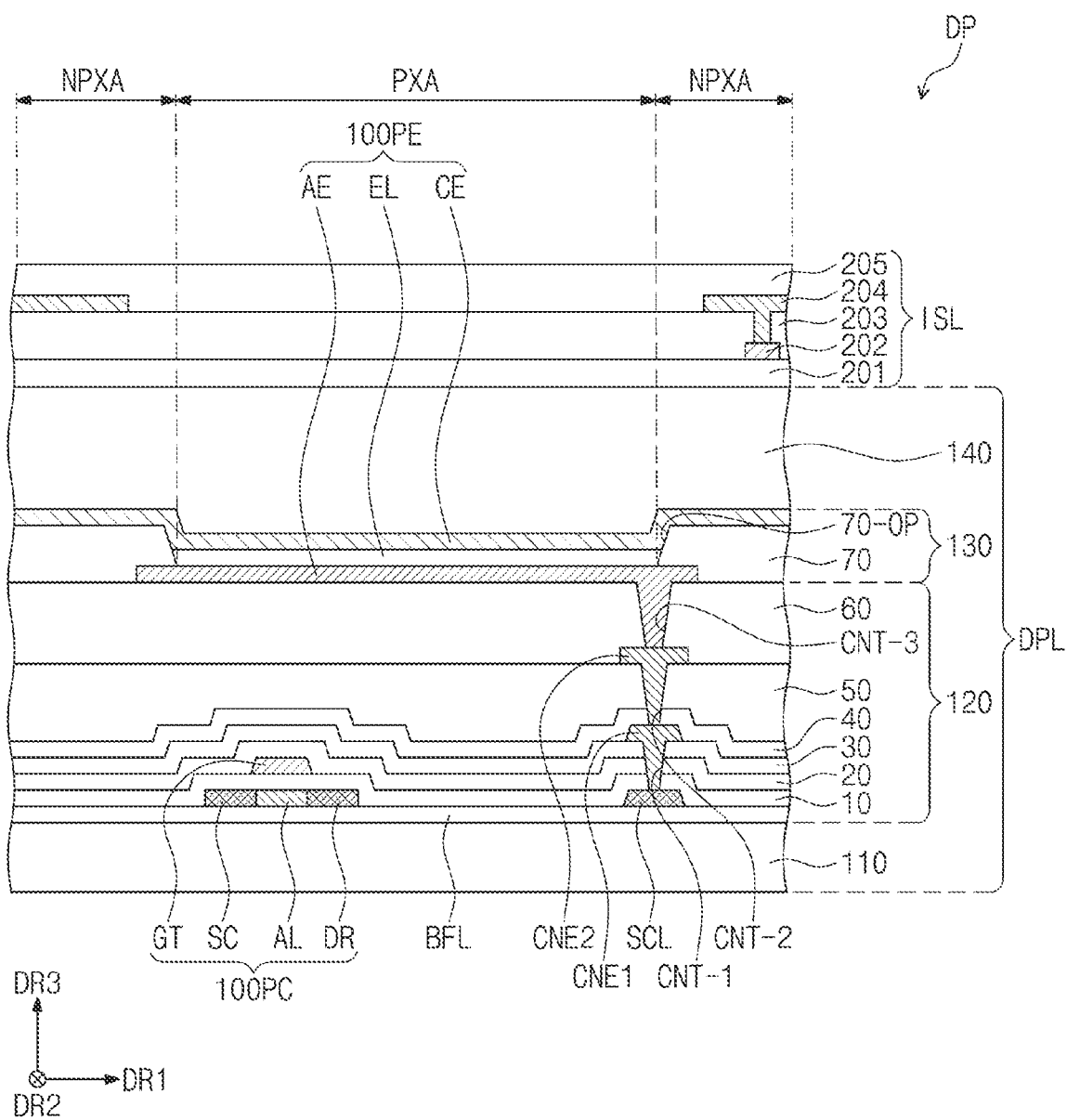
FIG. 3B is a cross-sectional view of a display panel according to an embodiment of the inventive concept.

FIG. 3B is a cross-sectional view of a display panel according to an embodiment of the inventive concept.

Referring to FIG. 3B, the display layer DPL may include a base layer 110, a circuit layer 120, a light emitting element layer 130, and a sealing layer 140 (e.g., an encapsulation layer).

The base layer 110 may be a member having a base surface on which the circuit layer 120 is disposed. The base layer 110 may be a glass substrate, a metal substrate, or a polymer substrate. However, the inventive concept is not limited thereto. For example, the base layer 110 may be an inorganic layer, an organic layer, or a composite material layer.

The base layer 110 may have a multilayer structure. For example, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide resin. In addition, each of the first and second synthetic resin layers may include at least one of acrylic resin, methacrylate resin, polyisoprene resin, vinyl resin, epoxy resin, urethane resin, cellulose resin, siloxane resin, polyamide resin, and perylene resin. On the other hand, in the present specification "~~"-based resin means to include a functional group of "~~".

In an embodiment, at least one inorganic layer is formed on the upper surface of the base layer 110. The inorganic layer may include at least one of aluminum oxide, titanium oxide, silicon oxide, silicon nitride, silicon oxynitride, zirconium oxide, and hafnium oxide. The inorganic layer may be formed in multiple layers. The multi-layered inorganic layers may constitute a barrier layer and/or a buffer layer. In this embodiment, the display layer DPL is shown to include the buffer layer BFL.

The buffer layer BFL may increase a bonding force between the base layer 110 and the semiconductor pattern. The buffer layer BFL may include at least one of silicon oxide, silicon nitride, and silicone oxynitride. For example, the buffer layer BFL may have a structure in which a silicon oxide layer and a silicon nitride layer are alternately stacked.

The semiconductor pattern may be disposed on the buffer layer BFL. The semiconductor pattern may include polysilicon. However, the inventive concept is not limited thereto, and the semiconductor pattern may include amorphous silicon, low-temperature polycrystalline silicon, or an oxide semiconductor.

FIG. 3B illustrates only some semiconductor patterns, and semiconductor patterns may be further disposed in other areas. The semiconductor pattern may be arranged in a specific direction across the pixels. Semiconductor patterns may have different electrical properties depending on whether they are doped or not. The semiconductor pattern may include a first area having high conductivity and a second area having low conductivity. The first area may be doped with an N-type dopant or a P-type dopant. One of the first and second areas may include a P-type transistor that includes a doping area doped with a P-type dopant. The other of the first and second areas may include an N-type transistor that includes a doping area doped with an N-type dopant. The second area may be a non-doped area or an area doped with a lower concentration than the first area.

In an embodiment, the conductivity of the first area is greater than that of the second area, and may substantially serve as an electrode or a signal line. The second area may substantially correspond to the active (or channel) of the transistor. In other words, a part of the semiconductor pattern may be an active part of the transistor, another part of the semiconductor pattern may be a source or drain of the transistor, and another part of the semiconductor pattern may be a connection electrode or a connection signal line.

In an embodiment, each of the pixels has an equivalent circuit including seven transistors, one capacitor, and a light emitting element. However, the equivalent circuit diagram of the pixel may be modified in various forms. In FIG. 3B, one transistor 100PC and a light emitting element 100PE included in a pixel are illustrated as an example.

The source SC, an active layer AL (or active area), and the drain DR of the transistor 100PC may be formed from a semiconductor pattern. The source SC and the drain DR may extend in opposite directions from the active layer AL on a cross section. FIG. 3B shows a part of the connection signal wiring SCL formed from a semiconductor pattern. Although not shown in the drawing separately, the connection signal wiring SCL may be connected to the drain DR of the transistor 100PC on a plane.

The first insulating layer 10 may be disposed on the buffer layer BFL. The first insulating layer 10 may overlap a plurality of pixels in common and cover a semiconductor pattern. The first insulating layer 10 may be an inorganic layer and/or an organic layer, and may have a single layer or multilayer structure. The first insulating layer 10 may include at least one of aluminum oxide, titanium oxide, silicon oxide, silicon nitride, silicon oxynitride, zirconium oxide, and hafnium oxide. In this embodiment, the first insulating layer 10 may be a single-layer silicon oxide layer. In addition to the first insulating layer 10, the insulating layer of the circuit layer 120 to be described below may be an inorganic layer and/or an organic layer, and may have a single layer or multilayer structure. The inorganic layer may include at least one of the above-mentioned materials, but is not limited thereto.

The gate GT of the transistor 100PC is disposed on the first insulating layer 10. The gate GT may be a part of a metal pattern. The gate GT overlaps the active layer AL. In the process of doping the semiconductor pattern, the gate GT may function as a mask.

The second insulating layer 20 is disposed on the first insulating layer 10 and may cover the gate GT. The second insulating layer 20 may overlap the pixels in common. The second insulating layer 20 may be an inorganic layer and/or an organic layer, and may have a single layer or multilayer structure. The second insulating layer 20 may include at least one of silicon oxide, silicon nitride, and silicon oxynitride. In this embodiment, the second insulating layer 20 may have a multilayer structure including a silicon oxide layer and a silicon nitride layer.

The third insulating layer 30 may be disposed on the second insulating layer 20. The third insulating layer 30 may have a single layer or multilayer structure. For example, the third insulating layer 30 may have a multilayer structure including a silicon oxide layer and a silicon nitride layer.

A first connection electrode CNE1 may be disposed on the third insulating layer 30. The first connection electrode CNE1 may be connected to the connection signal wiring SCL through a contact hole CNT-1 penetrating the first, second, and third insulating layers 10, 20, and 30.

The fourth insulating layer 40 may be disposed on the third insulating layer 30. The fourth insulating layer 40 may be a single layer of silicon oxide. The fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 penetrating the fourth insulating layer 40 and the fifth insulating layer 50.

The sixth insulating layer 60 is disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include a light emitting element 100PE. For example, the light emitting element layer 130 may include an organic light emitting material, a quantum dot, a quantum rod, a micro LED, or a nano LED. Hereinafter, a description will be given that the light emitting element 100PE is an organic light emitting element, but the inventive concept is not particularly limited thereto.

The light emitting element 100PE may include a first electrode AE, a light emitting layer EL, and a second electrode CE.

The first electrode AE may be disposed on the sixth insulating layer 60. The first electrode AE may be connected to the second connection electrode CNE2 through a contact hole CNT-3 penetrating through the sixth insulating layer 60.

A pixel defining film 70 is disposed on the sixth insulating layer 60 and may cover a portion of the first electrode AE. An opening part 70-OP is defined in the pixel defining film 70. The opening part 70-OP of the pixel defining film 70 exposes at least a portion of the first electrode AE.

The display area DA (refer to FIG. 1A) may include an emission area PXA and a non-emission area NPXA adjacent to the emission area PXA. The non-emission area NPXA may surround the emission area PXA. In this embodiment, the emission area PXA is defined to correspond to a partial area of the first electrode AE exposed by the opening part 70-OP.

The light emitting layer EL may be disposed on the first electrode AE. The light emitting layer EL may be disposed in an area corresponding to the opening part 70-OP. That is, the light emitting layer EL may be formed separately on each of the pixels. When the light emitting layer EL is formed separately on each of the pixels, each of the light emitting layers EL may emit light of at least one color of blue, red, and green. However, the inventive concept is not limited thereto, and the light emitting layer EL may be connected to the pixels and provided in common. In this case, the light emitting layer EL may provide blue light or white light.

The second electrode CE may be disposed on the light emitting layer EL. In an embodiment, the second electrode CE has an integral shape and may be commonly disposed on a plurality of pixels.

Although not shown in the drawing, a hole control layer may be disposed between the first electrode AE and the light emitting layer EL. The hole control layer may be commonly disposed in the emission area PXA and the non-emission area NPXA. The hole control layer may include a hole transport layer and a hole injection layer. An electron control layer may be disposed between the light emitting layer EL and the second electrode CE. The electron control layer may include an electron transport layer and an electron injection layer. The hole control layer and the electron control layer may be commonly formed in a plurality of pixels using an open mask.

The sealing layer 140 may be disposed on the light emitting element layer 130. The sealing layer 140 may include an inorganic layer, an organic layer, and an inorganic layer sequentially stacked, but the layers constituting the sealing layer 140 are not limited thereto.

The inorganic layer may protect the light emitting element layer 130 from moisture and oxygen, and the organic layer may protect the light emitting element layer 130 from foreign substances such as dust particles. The inorganic layers may include a silicon nitride layer, a silicon oxynitride layer, a silicon oxide layer, a titanium oxide layer, or an aluminum oxide layer. The organic layer may include an acrylic organic layer, but is not limited thereto.

The sensor layer ISL may include a base layer 201, a first conductive layer 202, a detection insulating layer 203, a second conductive layer 204, and a cover insulating layer 205.

The base layer 201 may be an inorganic layer including at least one of silicon nitride, silicon oxynitride, and silicon oxide. Alternatively, the base layer 201 may be an organic layer including an epoxy resin, an acrylic resin, or an imide resin. The base layer 201 may have a single layer structure or may have a multilayer structure stacked along the third direction DR3.

Each of the first conductive layer 202 and the second conductive layer 204 may have a single layer structure or may have a multilayer structure stacked along the third direction DR3.

The single-layered conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium zinc tin oxide (IZTO), and the like. In addition, the transparent conductive material may include a conductive polymer such as PEDOT, metal nanowires, graphene, and the like.

The multilayered conductive layer may include metal layers. The metal layers may have a three-layer structure of, for example, titanium/aluminum/titanium. The multilayered conductive layer may include at least one metal layer and at least one transparent conductive layer.

At least one of the detection insulating layer 203 and the cover insulating layer 205 may include an inorganic film. The inorganic film may include at least one of aluminum oxide, titanium oxide, silicon oxide, silicon nitride, silicon oxynitride, zirconium oxide, and hafnium oxide.

At least one of the detection insulating layer 203 and the cover insulating layer 205 may include an organic film. The organic film may include at least one of acrylic resin, methacrylic resin, polyisoprene, vinyl resin, epoxy resin, urethane resin, cellulose resin, siloxane resin, polyimide resin, polyamide resin, and perylene resin.

Figure 4:
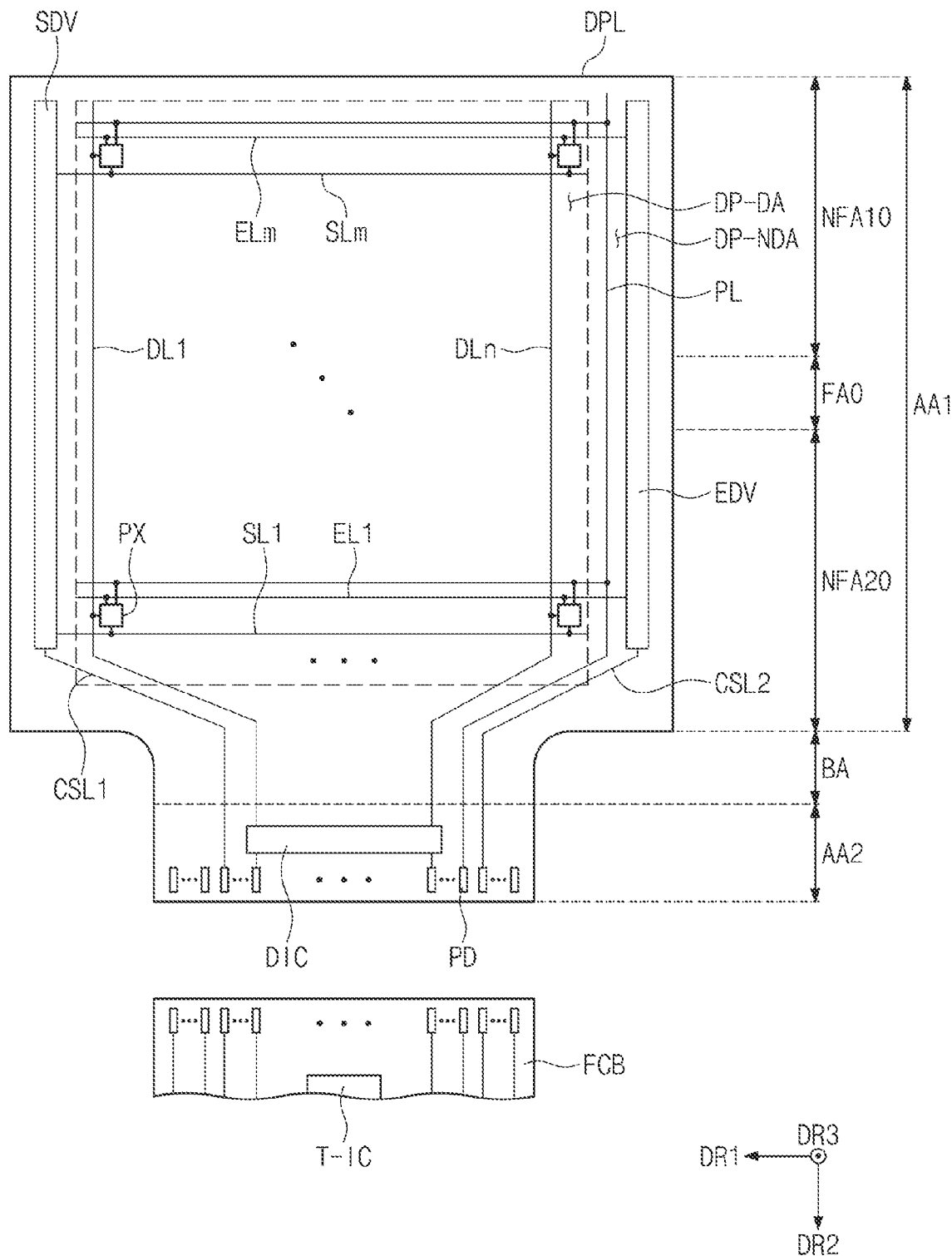
FIG. 4 is a plan view of a display layer according to an embodiment of the inventive concept.

FIG. 4 is a plan view of a display layer according to an embodiment of the inventive concept. The display layer DPL of FIG. 3A or FIG. 3B may be implemented by the display layer of FIG. 4.

Referring to FIG. 4, a display area DP-DA and a non-display area DP-NDA around the display area DP-DA may be defined in the display layer DPL. The display area DP-DA and the non-display area DP-NDA may be divided by whether or not the pixels PX are disposed. The pixel PX is disposed in the display area DP-DA. A scanning driving unit SDV (e.g., a gate driving circuit), a data driving unit (e.g., a data driving circuit), and an emission driving unit EDV (e.g., an emission driving circuit) may be disposed in the non-display area DP-NDA. The data driving unit may be one or more circuits configured in the driving chip DIC.

The display layer DPL may include a first panel area AA1, a bending area BA, and a second panel area AA2 defined along the second direction DR2. The second panel area AA2 and the bending area BA may be a partial area of the non-display area DP-NDA. The bending area BA is disposed between the first panel area AA1 and the second panel area AA2.

The first panel area AA1 is an area corresponding to the display surface DS of FIG. 1A. The first panel area AA1 may include a first non-folding area NFA10, a second non-folding area NFA20, and a folding area FAO. The first non-folding area NFA10, the second non-folding area NFA20, and the folding area FAO correspond to the first non-folding area NFA1, the second non-folding area NFA2, and the folding area FA of FIGS. 1A and 1B, respectively.

The width (or length) of the bending area BA parallel to the first direction DR1 and the width (or length) of the second panel area AA2 may be smaller than the width (or length) of the first panel area AA1 parallel to the first direction DR1. Areas with a short length in the bending axis direction may be bent more easily.

The display layer DPL may include a plurality of pixels PX, a plurality of scan lines SL1 to SLm, a plurality of data lines DL1 to DLn, a plurality of emission lines EL1 to ELm, second control lines CSL1 and CSL2, a power line PL, and a plurality of pads PD. Here, m and n are natural numbers. The pixels PX may be disposed in the display area DA and may be connected to the scan lines SL1 to SLm, the data lines DL1 to DLn, and the emission lines EL1 to ELm.

The scan lines SL1 to SLm may extend in the first direction DR1 and may be electrically connected to the scan driving unit SDV. The data lines DL1-DLn extend in the second direction DR2 and may be electrically connected to the driving chip DIC through the bending area BA. The emission lines EL1-ELm may extend in the first direction DR1 and may be electrically connected to the emission driving unit EDV.

The power line PL may include a portion extending in the second direction DR2 and a portion extending in the first direction DR1. The portion extending in the first direction DR1 and the portion extending in the second direction DR2 may be disposed on different layers. A portion of the power line PL extending in the second direction DR2 may extend to the second panel area AA2 through the bending area BA. The power line PL may provide a first voltage to the pixels PX.

The first control line CSL1 is connected to the scan driving unit SDV and may extend toward the lower end of the second panel area AA2 through the bending area BA. The second control line CSL2 is connected to the emission driving unit EDV and may extend toward the lower end of the second panel area AA2 through the bending area BA.

When viewed in a plan view, the pads PD may be disposed adjacent to the lower end of the second panel area AA2. The driving chip DIC, the power line PL, the first control line CSL1, and the second control line CSL2 may be electrically connected to the pads PD. The flexible circuit film FCB may be electrically connected to the pads PD through an anisotropic conductive adhesive layer.

Figure 5A:
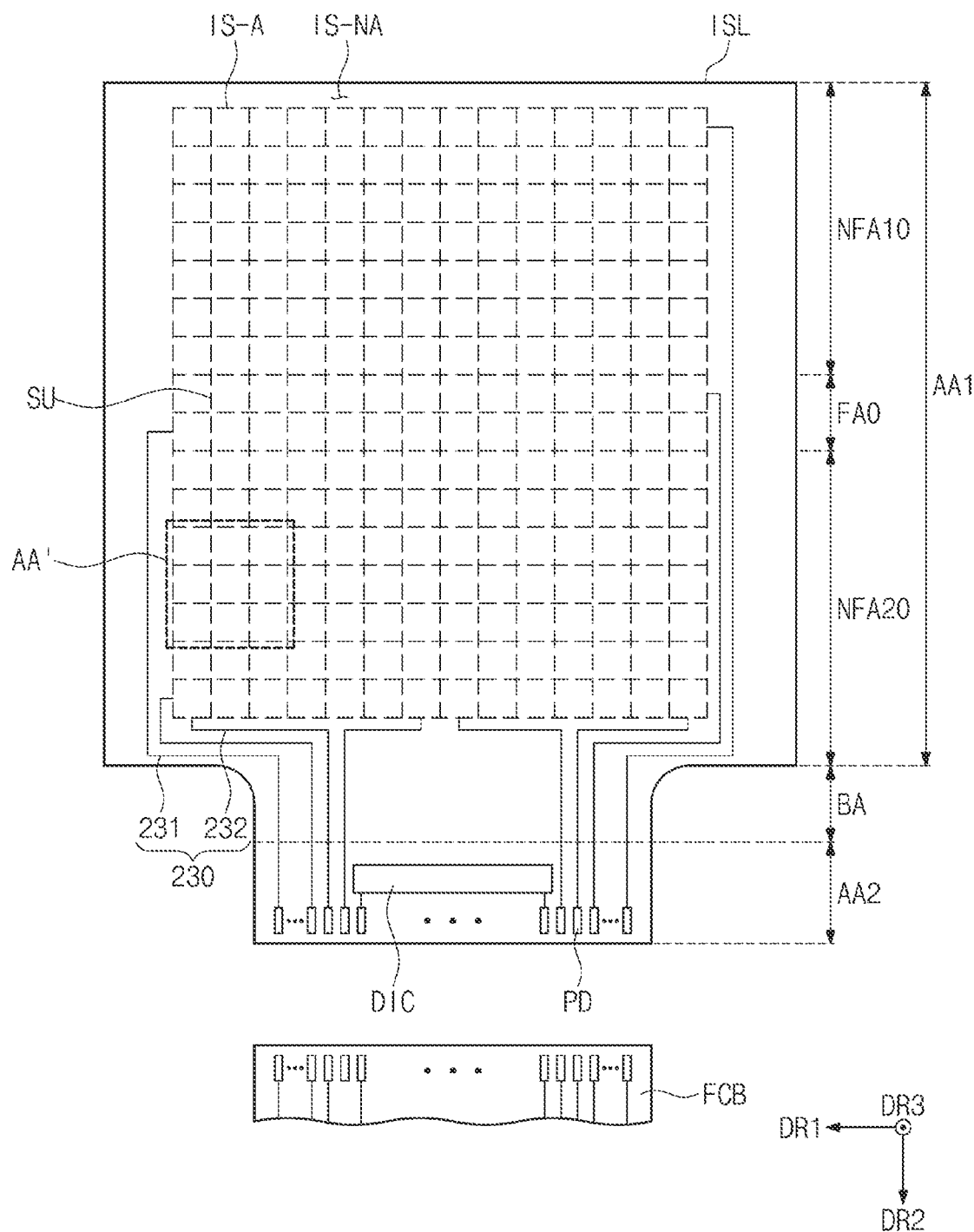
FIG. 5A is a plan view of a sensor layer according to an embodiment of the inventive concept.
Figure 5B:
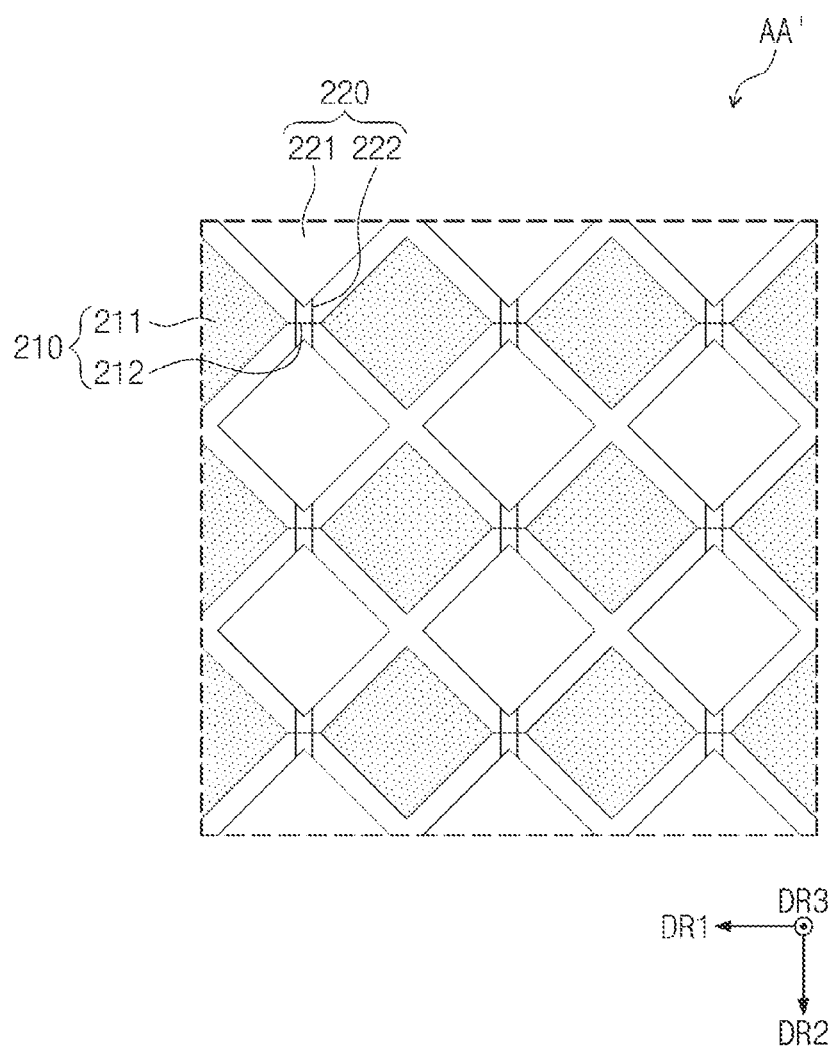
FIG. 5B is an enlarged plan view of an area AA' shown in FIG. 5A.

FIG. 5A is a plan view of a sensor layer according to an embodiment of the inventive concept. FIG. 5B is an enlarged plan view of an area AA' shown in FIG. 5A.

Referring to FIGS. 5A and 5B, a detection area IS-A and a peripheral area IS-NA may be defined in the sensor layer ISL. The detection area IS-A may be an area activated according to an electrical signal. For example, the detection area IS-A may be an area for detecting an external input. The peripheral area IS-NA is adjacent to the detection area IS-A and may surround the detection area IS-A.

The sensor layer ISL may include electrodes 210, cross electrodes 220, and sensing lines 230. The electrodes 210 and the cross electrodes 220 may be disposed in the detection area IS-A, and the detection lines 230 may be disposed in the peripheral area IS-NA. The sensor layer ISL may obtain information on an external input through a change in mutual capacitance between the electrodes 210 and the cross electrodes 220.

The sensor layer ISL may include a plurality of detection units SU. Each of the plurality of detection units SU may be defined as an area where one of the electrodes 210 and one of the cross electrodes 220 cross each other.

Each of the electrodes 210 may extend along the first direction DR1, and the electrodes 210 may be arranged along the second direction DR2. The electrodes 210 may include first portions 211 and a second portion 212. The second portion 212 may be adjacent to two first portions 211 adjacent to each other.

The cross electrodes 220 may be arranged along the first direction DR1, and each of the cross electrodes 220 may extend along the second direction DR2. The cross electrodes 220 may include patterns 221 and connection patterns 222 (or bridge patterns). The connection patterns 222 may electrically connect two adjacent patterns 221 to each other. The two patterns 221 adjacent to each other may be connected to each other by the two connection patterns 222, but the inventive concept is not limited thereto. The second portion 212 may insulately cross the two connection patterns 222. For example, an insulation layer may be present between the two connection patterns 22 and a portion of the second portion that crosses the two connection patterns 222.

The patterns 221, the first portions 211, and the second portions 212 may be disposed on the same layer as each other, and the connection patterns 222 may be disposed on a layer different from the patterns 221, the first portions 211, and the second portions 212. For example, the patterns 221, the first portions 211, and the second portions 212 may be included in the second conductive layer 204 (see FIG. 3B), and the connection patterns 222 may be included in the first conductive layer 202 (see FIG. 3A), and this structure may be referred to as a bottom bridge structure. However, the inventive concept is not particularly limited thereto. For example, the patterns 221, the first portions 211, and the second portions 212 may be included in the first conductive layer 202 (see FIG. 3B), and the connection patterns 222 may be included in the second conductive layer 204 (see FIG. 3B), and this structure may be referred to as a top bridge structure.

The shape and arrangement relationship of the electrodes 210 and the cross electrodes 220 shown in FIG. 5B is only illustrated as an example, and the shape and arrangement of the electrodes 210 and the cross electrodes 220 constituting the sensor layer ISL are not limited to those shown in FIG. 5B.

The detection lines 230 may be electrically connected to corresponding pads among the pads PD, respectively. The detection lines 230 may include lines 231 and crossing lines 232.

The lines 231 may be electrically connected to the electrodes 210, respectively. Some of the lines 231 may be connected to the left side of some of the electrodes 210, and another part of the lines 231 may be connected to the right of another part of the electrodes 210, respectively. The crossing lines 232 may be electrically connected to the cross electrodes 220, respectively. However, the connection relationship between the lines 231 and the electrodes 210 and the connection relationship between the crossing lines 232 and the cross electrodes 220 are not limited to the example illustrated in FIG. 5A.

In an embodiment, a touch driving chip T-IC is electrically connected to the sensor layer ISL, provides a driving signal to the sensor layer ISL, and calculates coordinates from an external input. The touch driving chip T-IC may be mounted on a flexible circuit board FCB (see FIG. 2). The touch driving chip T-IC may be electrically connected to the lines 231 and the crossing lines 232.

Figure 5C:
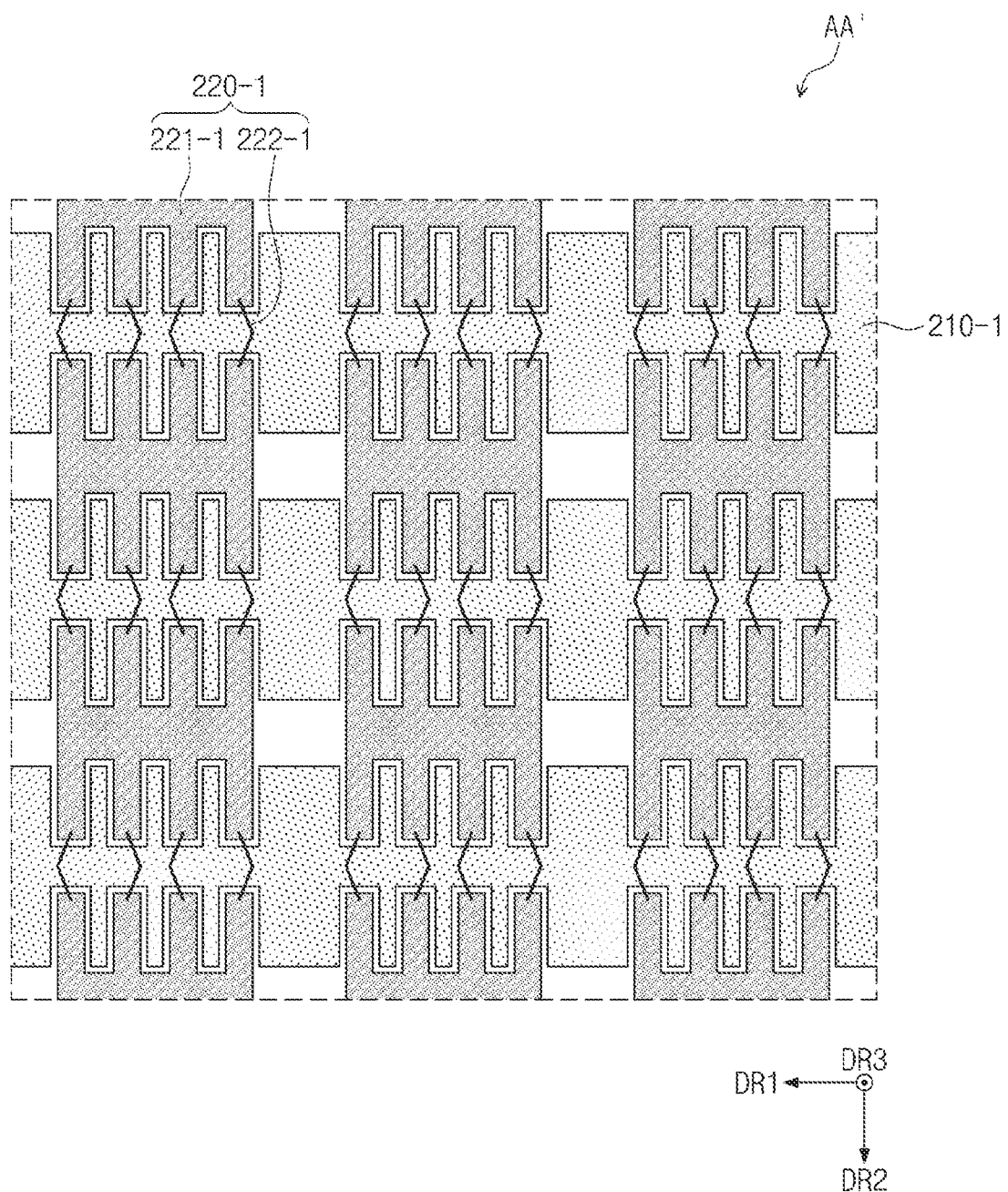
FIG. 5C is an enlarged plan view of an area AA' shown in FIG. 5A.

FIG. 5C is an enlarged plan view of an area AA' shown in FIG. 5A.

FIG. 5C exemplarily shows electrodes 210-1 and cross electrodes 220-1 having different shapes from those of FIG. 5B. The electrodes 210-1 and the cross electrodes 220-1 may have a bar shape. The electrode 210 of FIG. 5B may be implemented using the electrodes 210-1 of FIG. 5C. The cross electrodes 220 of FIG. 5B may be implemented using the cross electrodes 220-1 of FIG. 5C.

Each of the electrodes 210-1 may extend along the first direction DR1, and the electrodes 210-1 may be arranged along the second direction DR2. The cross electrodes 220-1 may be arranged along the first direction DR1, and each of the cross electrodes 220-1 may extend along the second direction DR2. The cross electrodes 220-1 may include patterns 221-1 and connection patterns 222-1 (or bridge patterns). The connection patterns 222-1 may electrically connect two adjacent patterns 221-1 to each other. The two patterns 221-1 adjacent to each other may be connected to each other by the two connection patterns 222-1, but the inventive concept is not limited thereto. One electrode 210-1 may insulately cross the two connection patterns 222. While the electrodes 210-1 and the patterns 221-1 are illustrated having a mesh shape, the inventive concept is not particularly limited thereto.

Figure 6:
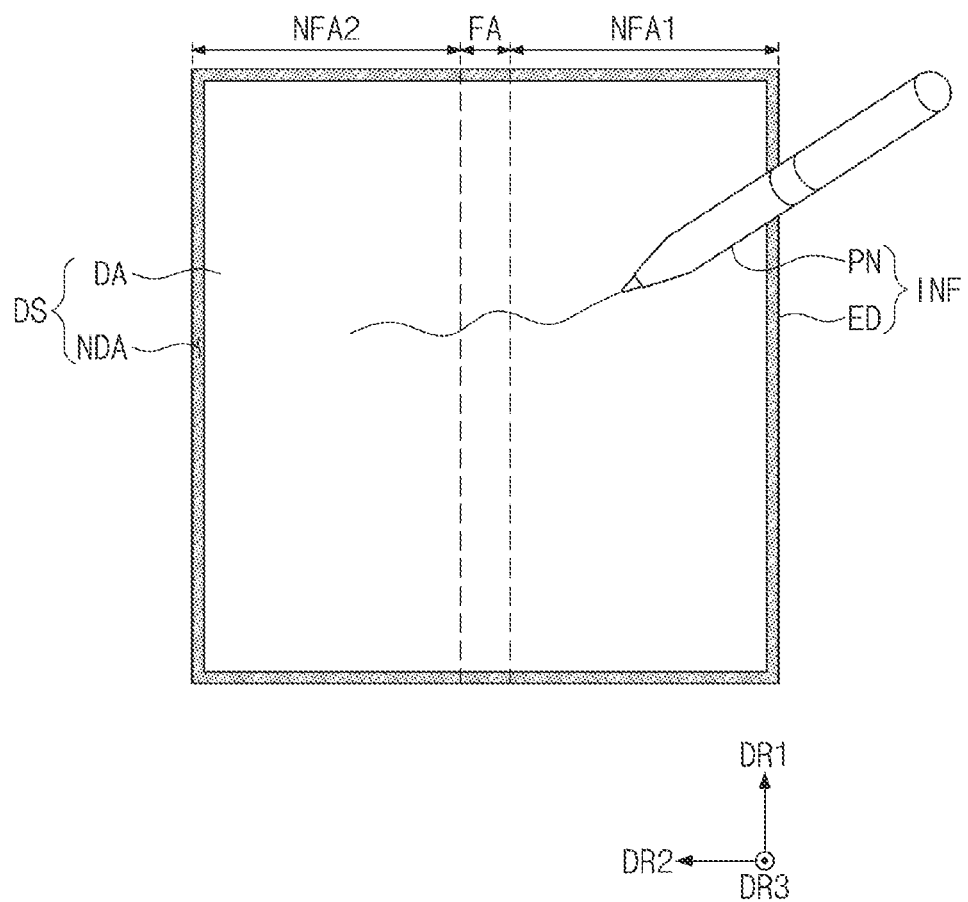
FIG. 6 is a diagram illustrating an interface device according to an embodiment of the inventive concept.

Each of the electrodes 210 or 210-1 and the cross electrodes 220 or 220-1 described with reference to FIGS. 5B and 5C may have a mesh structure. In this case, an opening may be defined in each of the electrodes 210 or 210-1 and the cross electrodes 220 or 220-1. However, the inventive concept is not limited thereto, and each of the electrodes 210 or 210-1 and the cross electrodes 220 or 220-1 may be a transparent electrode with no defined opening. FIG. 6 is a diagram illustrating an interface device according to an embodiment of the inventive concept.

Referring to FIG. 6, the interface device INF may include an electronic device ED and an electronic pen PN. The interface device INF may be referred to as an electronic system, a touch system, an input/output system, a digitizer system, a pen tablet, or a pen terminal.

In an embodiment. the electronic pen PN is an electronic pen that generates a magnetic field having a predetermined resonance frequency. The electronic pen PN may be configured to transmit an output signal based on an electromagnetic resonance method. The electronic pen PN may be referred to as an input device, a stylus pen, or an electromagnetic resonance pen.

The electronic pen PN according to an embodiment of the inventive concept includes a signal generator that generates alternating current (AC) power therein. In this case, in the electronic pen PN, even if there is no external magnetic field provided from the outside, induced current may be generated by the internal signal generator. Accordingly, even if the electronic device ED does not include a digitizer that generates a magnetic field, the electronic device ED may detect an input of the electronic pen PN that outputs the magnetic field.

The electronic pen PN may be operated by selecting one of an active type or a passive type according to whether or not the electronic device ED includes a digitizer. Accordingly, an electronic pen PN with increased performance that may be used in various environments may be provided.

The electronic pen PN using the electromagnetic resonance method has better output efficiency than a pen of an active electrostatic method (hereinafter, referred to as AES pen). For example, when a Tx signal of the same frequency (e.g., 1.8 MHz) and same input voltage (e.g., 17 V) is provided, the strength of the signal outputted from the electronic pen PN may be about 40 times stronger than the strength of the signal output from the AES pen. Also, the strength of the output signal of the electronic pen PN when a Tx signal with a frequency of 1.8 MHz and a voltage of 1 V is provided may be similar to the strength of the AES pen's output signal when a Tx signal with a frequency of 1.8 MHz and a voltage of 17V is provided. Accordingly, the electronic pen PN operating as an active type may consume less battery power than the AES pen.

In addition, when the electronic pen PN according to the embodiment of the inventive concept is applied, the electronic device ED need not include a digitizer. Accordingly, an increase in the thickness and weight of the electronic device ED due to the addition of the digitizer, and a decrease in flexibility due to the addition of the digitizer do not occur. The electronic device ED from which the digitizer is omitted may detect an input of the electronic pen PN using the sensor layer ISL (refer to FIG. 3A).

Figure 7:
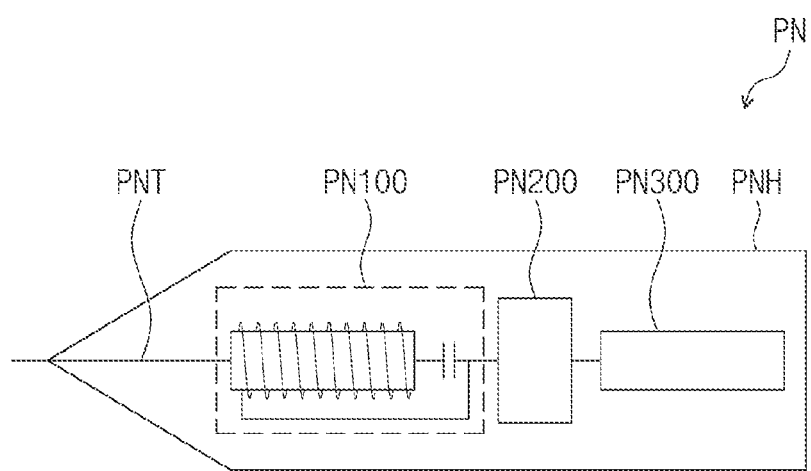
FIG. 7 is a block diagram of an electronic pen according to an embodiment of the inventive concept.

FIG. 7 is a block diagram of an electronic pen according to an embodiment of the inventive concept.

Referring to FIG. 7, the electronic pen PN includes a housing PNH, a pen tip PNT, a resonance circuit PN100, a signal generator PN200, and a power supply PN300.

The housing PNH may have a pen shape, and may be formed in an accommodation space therein. For example, the pen shape may be cylindrical or somewhat cylindrical. The resonance circuit PN100, the signal generator PN200, and the power supply PN300 may be accommodated in the accommodation space defined inside the housing PNH. The pen tip PNT may be disposed at an end portion of the housing PNH. For example, a portion of the pen tip PNT may be exposed outside the housing PNH, and the remaining portion of the pen tip PNT may be located within the housing PNH.

In an embodiment, the resonance circuit PN100 includes an inductor and a capacitor. The capacitor may store the current flow due to the signal (or Tx signal) as an electric field, and the inductor may store the current flow due to the signal as a magnetic field. The inductor may include a magnetic material and a coil wound around the magnetic material.

The signal generator PN200 may be a component that generates a signal (or a Tx signal). The signal generator PN200 may include a specific-purpose integrated circuit or oscillator. The signal generator PN200 may output an AC signal having a frequency having a predetermined value. For example, the signal generated by the signal generator PN200 may be a fixed frequency signal. For example, the signal may be a 560 kHz sine wave, but is not particularly limited thereto.

The resonance circuit PN100 may be charged by the signal generator PN200. Accordingly, the signal generator PN200 may stop signal transmission after charging the resonance circuit PN100. In an embodiment, the signal generator PN200 outputs the signal during a first period to charge the resonance circuit PN100, then the signal generation PN200 stops outputting the AC signal during a second period after the first period. An induced current is generated in the resonance circuit PN100 by the signal, and the resonance circuit PN100 may resonate by the induced current to emit a magnetic field.

The power supply PN300 may supply power to the signal generator PN200. The power supply PN300 may include a battery or a high capacity capacitor.

According to an embodiment of the inventive concept, since the electronic pen PN includes the signal generator PN200 therein, the electronic pen PN may operate as a passive type or an active type. Accordingly, even if the electronic device ED (see FIG. 6) does not include a digitizer that generates a magnetic field, the electronic device ED may detect an input of the electronic pen PN that outputs the magnetic field.

Figure 8A:
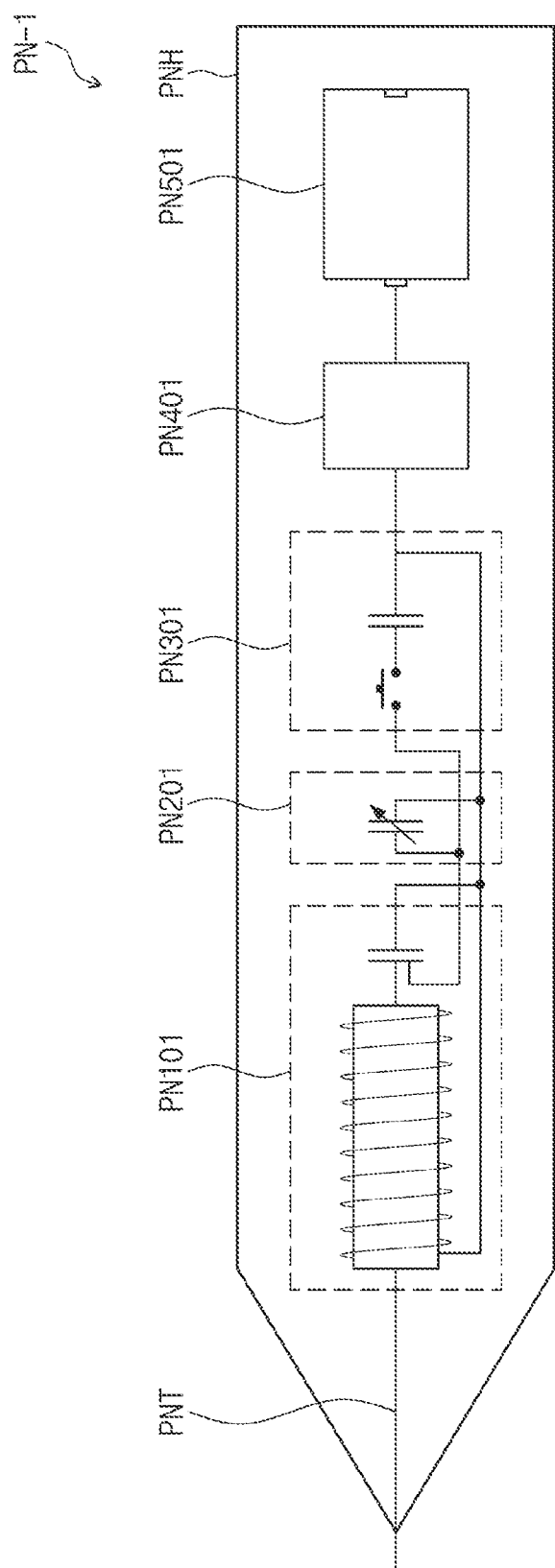
FIG. 8A is a block diagram of an electronic pen according to an embodiment of the inventive concept.
Figure 8B:
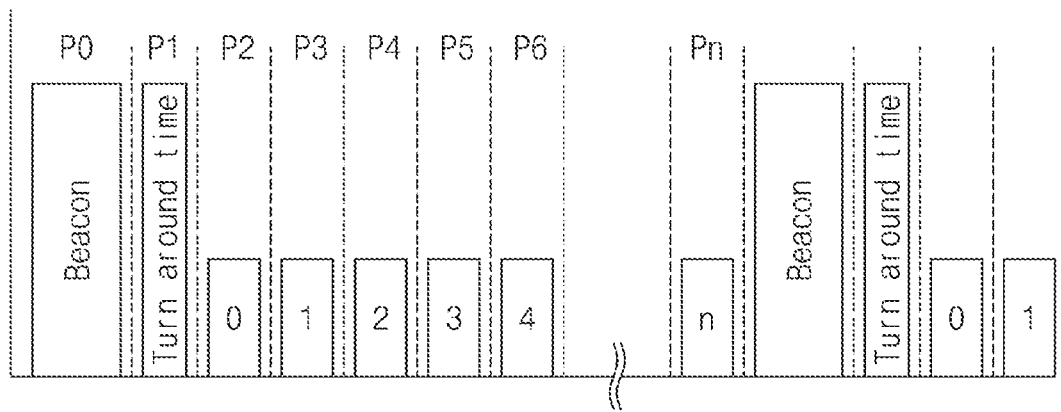
FIG. 8B is a diagram illustrating a protocol of a signal outputted from an electronic pen according to an embodiment of the inventive concept.

FIG. 8A is a block diagram of an electronic pen according to an embodiment of the inventive concept. FIG. 8B is a diagram illustrating a protocol of a signal outputted from an electronic pen according to an embodiment of the inventive concept.

Referring to FIGS. 8A and 8B, the electronic pen PN-1 includes a housing PNH, a pen tip PNT, a resonance circuit PN101, and a pen pressure detector PN201 (e.g., detection circuit), a switch PN301, a signal generator PN401, and a power supply PN501.

The pen pressure detector PN201 is electrically connected to the resonance circuit PN101 and may detect physical pressure applied to the pen tip PNT. For example, the pen pressure detector PN201 may include a variable capacitor. The variable capacitor included in the pen pressure detector PN201 may be connected in parallel to a capacitor included in the resonance circuit PN101. When no pressure is applied, the resonance frequency of the magnetic field output from the resonance circuit PN101 is the reference resonance frequency. When pressure is applied, a change in capacitance may occur due to the variable capacitor, and accordingly, the resonance frequency of the magnetic field output from the resonance circuit PN101 may be varied.

The switch PN301 may include a button and at least one capacitor. The button may be operated by a user using the electronic pen PN-1. For example, the housing PNH may include an opening and a surface of the button may be located in the opening to enable a user to operate the button. According to the manipulation of the switch PN301, the electronic pen PN-1 may be switched to a pen input mode, a right-click mode, or an eraser mode. In an embodiment, the pen PN-1 can be switched to one of the active mode and the passive mode by a user selecting the button. The active mode and the passive modes are pen input modes. In an embodiment, the pen PN-1 can be switched between one of a drawing mode and the eraser mode by a user selecting the button. For example, information transmitted by the pen PN-1 is interpreted by the electronic device EC as information used to draw an object in the drawing mode, and information transmitted by the pen PN-1 is interpreted by the electronic device EC as information used to erase the object in the eraser mode.

The signal generator PN401 may output an AC signal having a frequency having a predetermined value. Accordingly, as described above with reference to FIG. 7, the resonance circuit PN101 may be charged by the signal generator PN401. Accordingly, since the electronic pen PN-1 includes the signal generator PN401 therein, it may operate as an active type or a passive type.

The signal generator PN401 may be a specific-purpose integrated circuit. In this case, the signal generator PN401 may further generate a signal including various information as well as an AC signal for charging the resonance circuit PN101. For example, the signal generator PN401 may further output an information signal according to the protocol shown in FIG. 8B. The information signal may include tilt information, pressure information, and button information of the electronic pen PN-1. For example, the button information may indicate whether the electronic pen PN-1 is in the active mode, the passive mode, the drawing mode, the eraser mode, or the right-click mode. The signal generator PN401 may transmit the information in the form of a data packet to the electronic device ED (see FIG. 6). The signal generator PN401 may transmit a signal using a modulation method.

When the signal generator PN401 transmits (or downlinks) a signal, the modulation method may include on-off keying (OOK), phase shift keying (PSK), differential phase shift modulation (PSK), frequency shift keying (FSK), binary phase shift keying (BPSK), or differential binary phase shift keying (BPSK).

For example, as shown in FIG. 8B, the signal generator PN401 may transmit a beacon signal during a first time P0. The beacon signal may be a synchronization signal to enable the electronic device ED to synchronize with the electronic device ED (see FIG. 6). Thereafter, the second time P1 may be an average turnaround time. Thereafter, the signal generator PN401 may transmit information in the form of a data packet from the third time P2. For example, the signal generator PN401 may transmit the information after the second time P1. While FIG. 8B shows times P3, P4, P5, P6, . . . , Pn for transmitting different portions of the information, one or more of these times may be omitted. For example, upon the electronic device ED detecting the beacon signal, the electronic device ED has until the turnaround time to begin sampling to detect the transmitted information. In an embodiment, the beacon signal differs from the transmitted information so that the electronic device ED is able to distinguish between them for synchronization.

Figure 9:
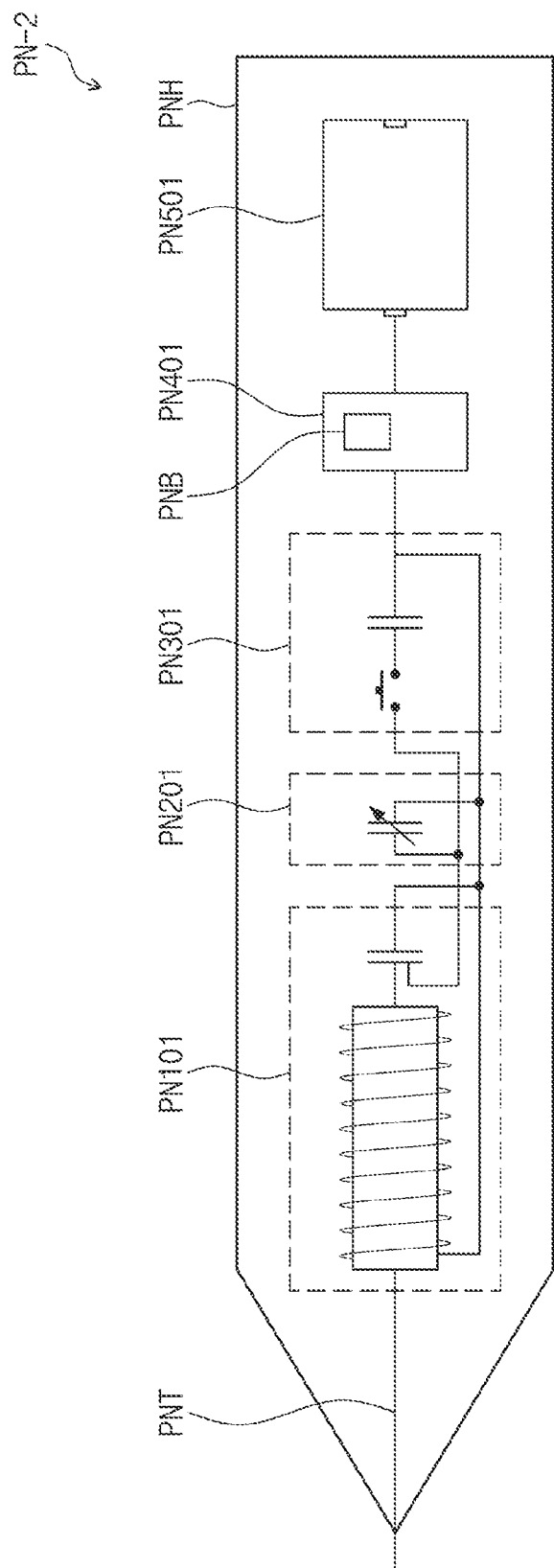
FIG. 9 is a block diagram of an electronic pen according to an embodiment of the inventive concept.

FIG. 9 is a block diagram of an electronic pen according to an embodiment of the inventive concept.

Referring to FIG. 9, the electronic pen PN-2 includes a housing PNH, a pen tip PNT, a resonance circuit PN101, a pen pressure detector PN201, a switch PN301, a signal generator PN401, and a power supply PN501.

The signal generator PN401 may further generate a signal including various information as well as an AC signal for charging the resonance circuit PN101. For example, the signal generator PN401 may further generate signals including tilt information, pressure information, and button information of the electronic pen PN-1. For example, the button information may indicate a certain mode that has been selected by the user using the button. For example, the tilt information may indicate an angle or orientation of the electronic pen relative to a plane or surface of the display.

The signal generator PN401 may include a wireless communication module PNB. The signal generator PN401 may transmit the information to the electronic device ED (see FIG. 6) using the wireless communication module PNB. The wireless communication module PBN may support a Bluetooth communication protocol, but is not particularly limited thereto. The electronic device ED may include an antenna and a receiver or a transceiver to wirelessly receive the information.

Figure 10A:
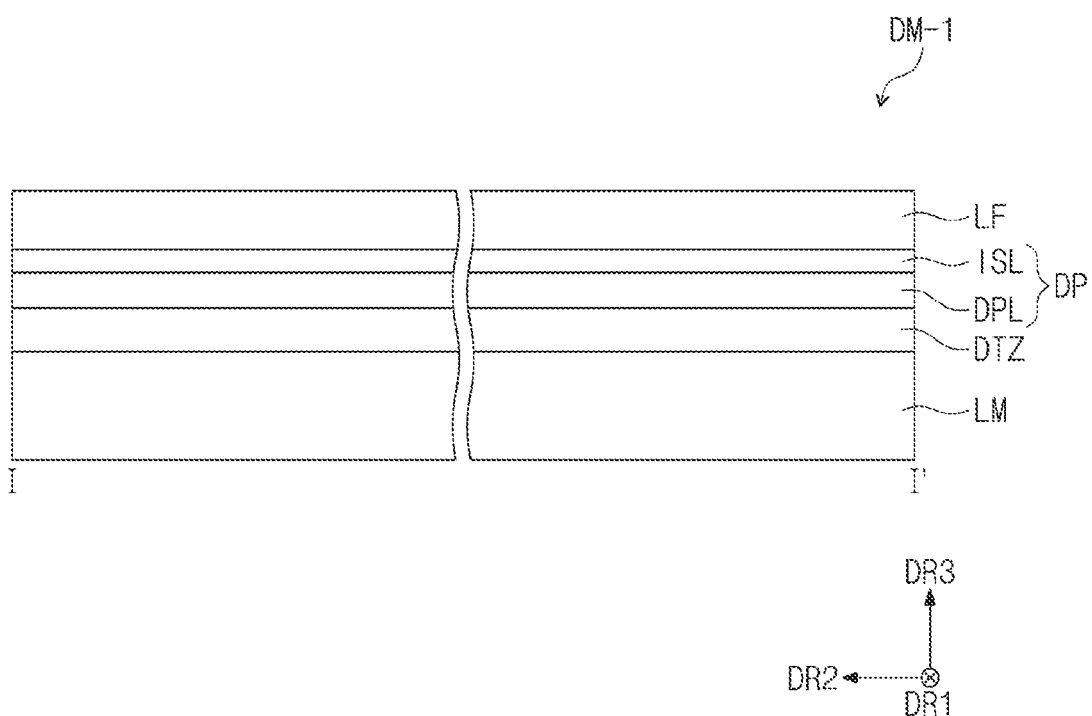
FIG. 10A is a cross-sectional view of a display module according to an embodiment of the inventive concept.
Figure 10B:
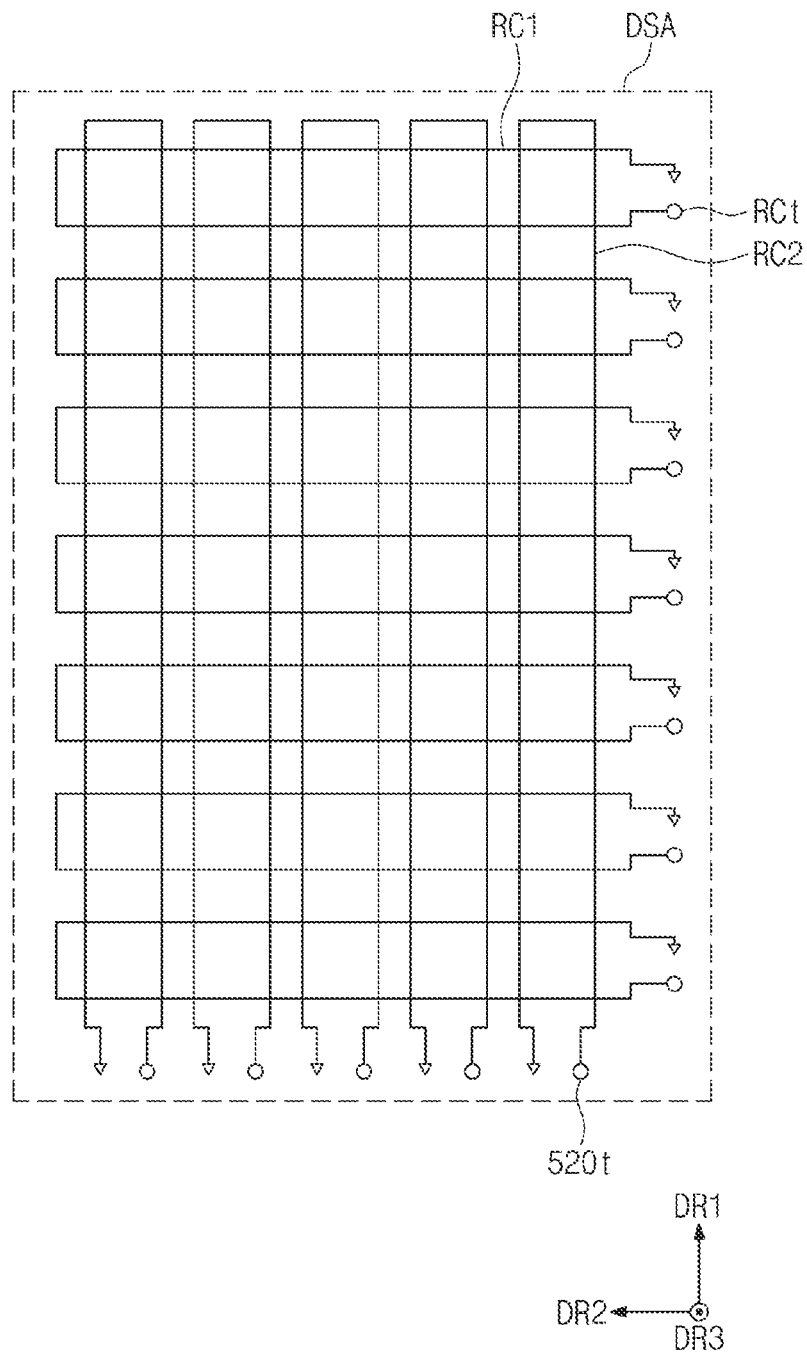
FIG. 10B is an equivalent circuit diagram of a digitizer according to an embodiment of the inventive concept.

FIG. 10A is a cross-sectional view of a display module according to an embodiment of the inventive concept. FIG. 10B is an equivalent circuit diagram of a digitizer according to an embodiment of the inventive concept.

Referring to FIG. 10A, the display module DM-1 may include a display panel DP, an optical film LF disposed on the display panel DP, a lower member LM disposed under the display panel DP, and a digitizer DTZ disposed between the display panel DP and the lower member LM. The display module DM of FIG. 2 may be implemented using the display module DM-1. The digitizer DTZ may include a plurality of loop coils that generate a magnetic field having a preset resonance frequency with the electronic pen PN (see FIG. 6). The digitizer DTZ may also be referred to as an electromagnetic resonance (EMR) detection panel.

Referring to FIGS. 10A and 10B, the digitizer DTZ may include a plurality of first loop coils RC1 (hereinafter referred to as first coils) and a plurality of second loop coils RC2 (hereinafter referred to as second coils) in the detection area DSA.

The first coils RC1 may be referred to as driving coils, and the second coils RC2 may be referred to as detection coils, but are not limited thereto and vice versa.

Each of the first coils RC1 is arranged along a first direction DR1, and extends along a second direction DR2. Each of the second coils RC2 may extend along the first direction DR1, and the second coils RC2 may be arranged to be spaced apart from each other in the second direction DR2. Unlike that shown in FIG. 10B, the first coils RC1 may be arranged so that adjacent coils overlap each other. A bridge pattern may be disposed in the crossing area of the first coils RC1. The second coils RC2 may be arranged so that adjacent coils overlap each other. A bridge pattern may be disposed in the crossing area of the second coils RC2.

An AC signal may be sequentially provided to first terminals RCt of the first coils RC1. The first terminals RCt of the first coils RC1 and one other terminal may be grounded. Although not shown in FIG. 10B, signal lines may be respectively connected to the first terminals RCt of the first coils RC1.

When a current flows through the first coils RC1, a line of magnetic force may be induced between the first coils RC1 and the second coils RC2. The second coils RC2 may detect the induced electromagnetic force emitted from the electronic pen PN (refer to FIG. 6) and output the detected induced electromagnetic force as a detection signal.

Figure 11:
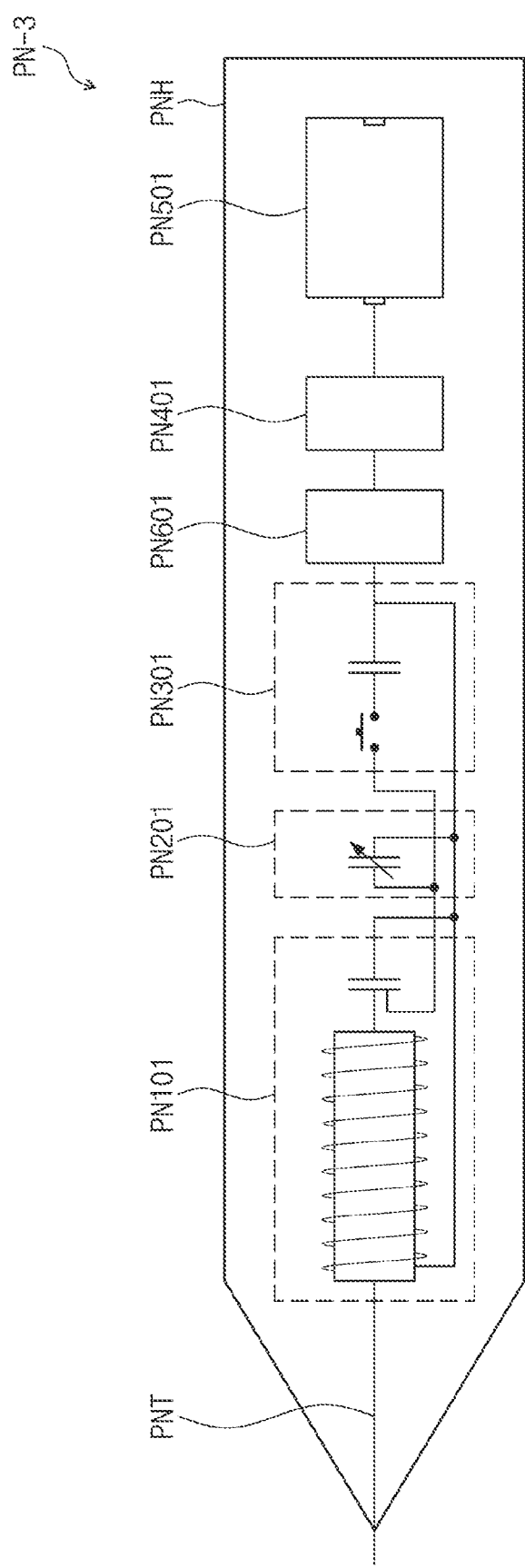
FIG. 11 is a block diagram of an electronic pen according to an embodiment of the inventive concept.

FIG. 11 is a block diagram of an electronic pen according to an embodiment of the inventive concept.

Referring to FIG. 11, the electronic pen PN-3 includes a housing PNH, a pen tip PNT, a resonance circuit PN101, a pen pressure detector PN201, a switch PN301, a signal generator PN401, a power supply PN501, and a signal detector PN601.

The signal detector PN601 may detect an external magnetic field provided from the outside, and control transmission of a signal according to whether the external magnetic field is detected. In an embodiment, the electronic pen PN-3 operates as a passive type when an external magnetic field is detected, and operates as an active type when an external magnetic field is not detected.

Figure 12A:
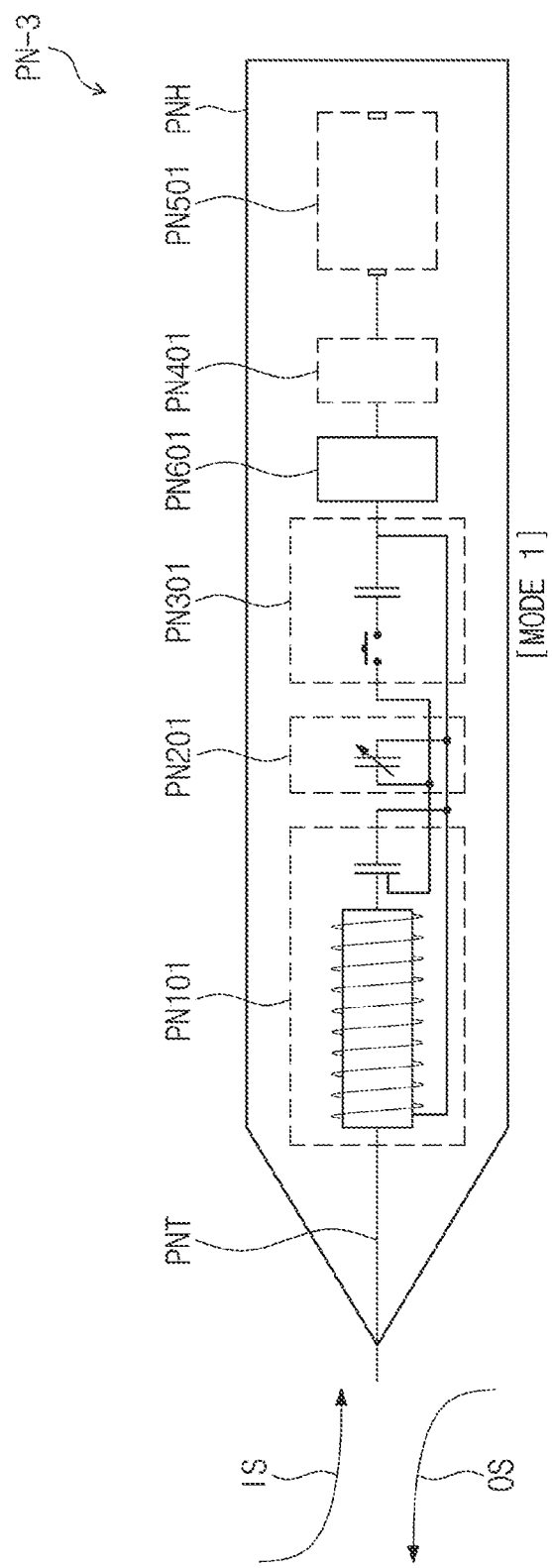
FIG. 12A is a block diagram of an electronic pen according to an embodiment of the inventive concept.
Figure 12B:
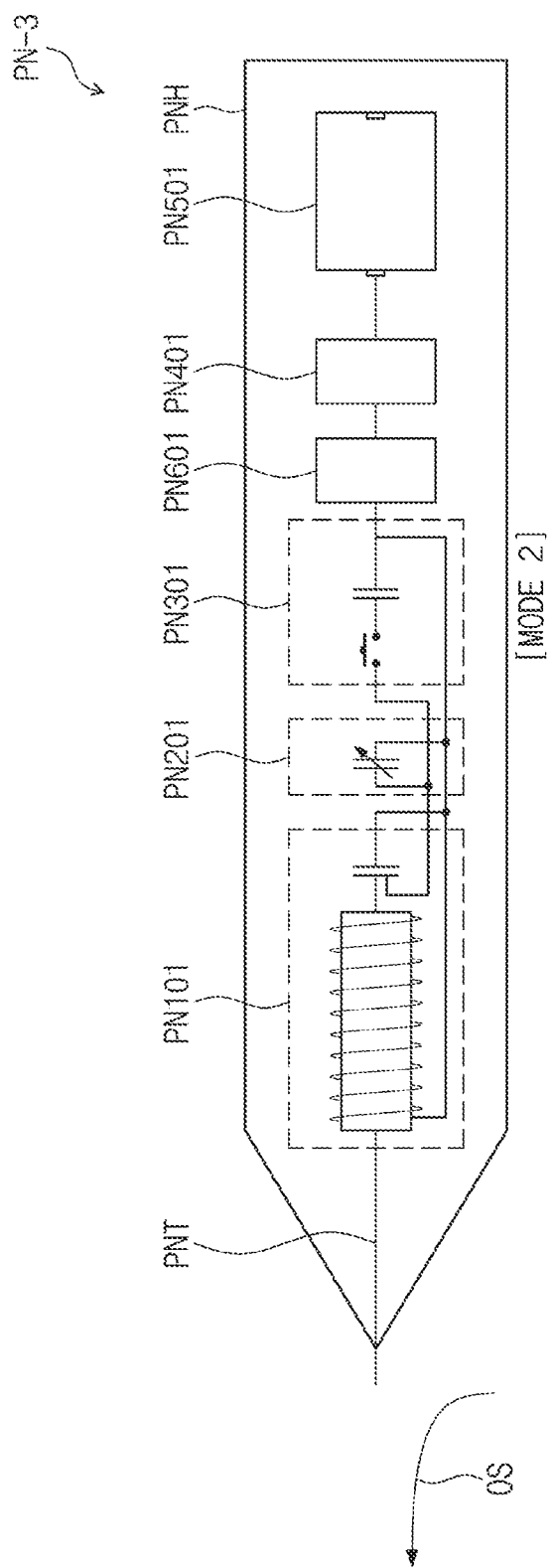
FIG. 12B is a block diagram of an electronic pen according to an embodiment of the inventive concept.

FIG. 12A is a block diagram of an electronic pen according to an embodiment of the inventive concept. FIG. 12B is a block diagram of an electronic pen according to an embodiment of the inventive concept. FIG. 12A is a diagram illustrating an electronic pen PN-3 operating in a first mode (or a passive mode), and FIG. 12B is a diagram illustrating an electronic pen PN-3 operating in a second mode (or an active mode).

Referring to FIGS. 10A, 10B, and 12A, when the electronic pen PN-3 is used in an electronic device ED (refer to FIG. 6) including the digitizer DTZ, an external magnetic field IS may be provided to the electronic pen PN-3. The external magnetic field IS may be a magnetic field generated by the digitizer DTZ.

In this case, the signal detector PN601 may control the operation of the signal generator PN401 to operate the electronic pen PN-3 in a passive type. For example, the signal detector PN601 may prevent the signal generator PN401 from generating a signal. Accordingly, the resonance circuit PN101 does not receive a signal from the signal generator PN401.

When the electronic pen PN-3 is operated in a passive type, the magnetic field formed in the digitizer DTZ is applied to the resonance circuit PN101 of the electronic pen PN-3. The inductor (or coil) generates a current due to a received magnetic field and transmits the generated current to a capacitor. Accordingly, the capacitor charges the current inputted from the coil and discharges the charged current into the coil. That is, the resonance circuit PN101 may emit a magnetic field OS having a resonance frequency.

The magnetic field OS emitted by the electronic pen PN-3 may be absorbed again by the loop coils RC1 and RC2 of the digitizer DTZ, and the electronic device ED (refer to FIG. 6) may determine to which position the electronic pen PN-3 is close.

Referring to FIGS. 3A, 3B, and 12B, when the electronic pen PN-3 is used in the electronic device ED (see FIG. 6) that does not include a digitizer, the electronic pen PN-3 may be operated in a second mode (or active type).

In this case, the signal generator PN401 may output an AC signal having a frequency having a predetermined value. The resonance circuit PN101 may be charged by the signal generator PN401. The resonance circuit PN101 generates a current due to a received magnetic field and transfers the generated current to a capacitor. Accordingly, the capacitor charges the current inputted from the coil and discharges the charged current into the coil. That is, the magnetic field OS of the resonance frequency may be emitted to the resonance circuit PN101.

According to an embodiment of the inventive concept, since the electronic pen PN-3 includes a signal generator PN401 therein, it may operate as a passive type or an active type. Accordingly, even if the electronic device ED (see FIG. 6) does not include a digitizer that generates a magnetic field, the electronic device ED may detect an input of the electronic pen PN-3 that outputs the magnetic field.

Figure 13A:
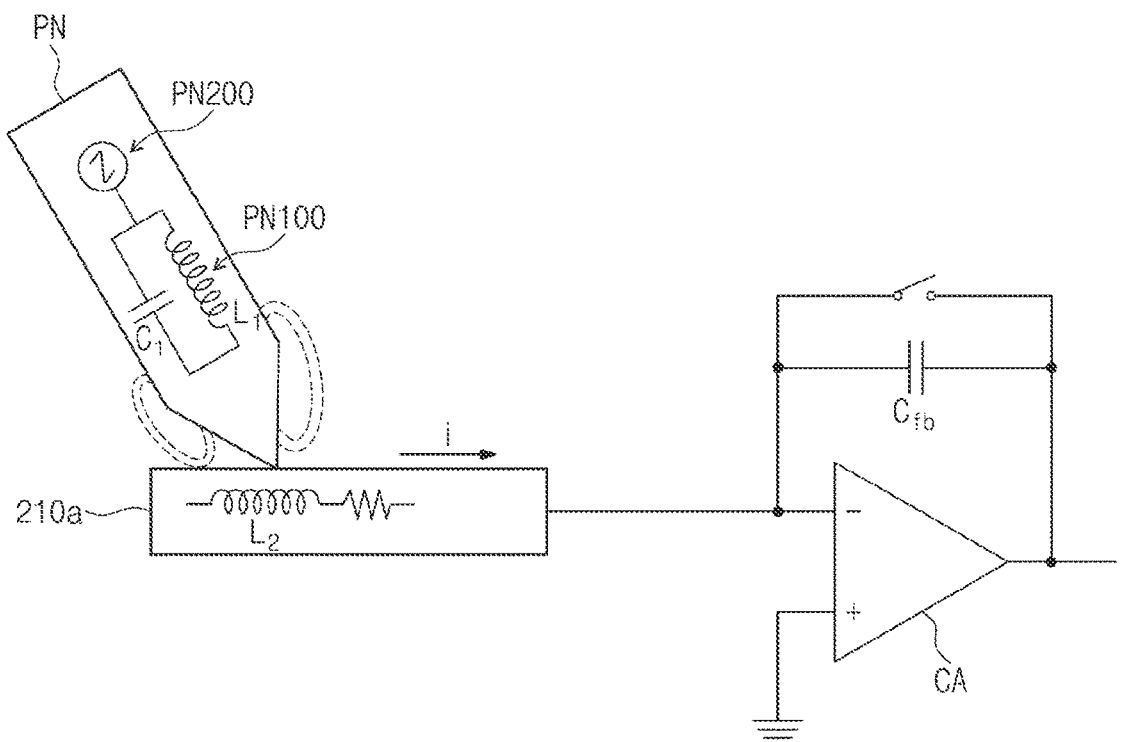
FIG. 13A is a diagram illustrating a method of sensing an input by an electronic device by an electronic pen according to an embodiment of the inventive concept.

FIG. 13A is a diagram illustrating a method of sensing an input by an electronic device by an electronic pen according to an embodiment of the inventive concept.

Referring to FIGS. 5A, 5B, and 13A, the touch driving chip T-IC may operate in a first touch mode for sensing a user's touch or a second touch mode for sensing an input by the electronic pen PN. For example, the first touch mode may be a mode in which a TX signal is transmitted to the electrodes 210 (refer to FIG. 4B) and an RX signal is received from the cross electrodes 220. The second touch mode may be a mode in which an electronic pen PN detection signal is received from at least one of the electrodes 210 and the cross electrodes 220.

The touch driving chip T-IC may alternately and repeatedly operate in a first touch mode and a second touch mode. Alternatively, the touch driving chip T-IC may operate in the first touch mode, and then may switch to the second touch mode when a predetermined signal is provided from the electronic pen PN. The operation method of the touch driving chip T-IC is not limited to the above-described example.

In an embodiment, the touch driving chip T-IC includes a charge amplifier CA. The charge amplifier CA may receive an electrical signal that changes according to whether a user's touch or an input by the electronic pen PN is input, and may output the electrical signal as a touch signal.

In FIG. 13A, one electrode 210a of the electrodes 210 illustrated in FIG. 5 and a charge amplifier CA connected to the electrode 210a are illustrated. The inverting input of the charge amplifier CA may be electrically connected to the electrode 210a. A reference potential (or voltage) may be provided to the non-inverting input of the charge amplifier CA. A capacitor $C_{fb}$ may be connected to the inverting input of the charge amplifier CA and the output of the charge amplifier CA.

When the electronic pen PN approaches the electronic device ED, the electrodes 210, or the sensor layer ISL, an induced current i may flow through the electrode 210a based on a magnetic field B-field outputted from the electronic pen PN. A parasitic inductance $L_2$ is generated in the electrode 210a. The capacitor $C_{fb}$ may receive the induced current i and output a voltage signal based on the induced current.

According to an embodiment of the inventive concept, the electronic device ED (see FIG. 6) that does not include a separate digitizer is configured to detect not only a user's touch but also an input by the electronic pen PN using the sensor layer ISL (see FIG. 3B). That is, by using the sensor layer ISL (see FIG. 3A) and the touch driving chip T-IC (see FIG. 4), which detect a touch due to a change in mutual capacitance, an input by the electronic pen PN that provides an output signal based on an electromagnetic resonance method may also be detected.

Figure 13B:
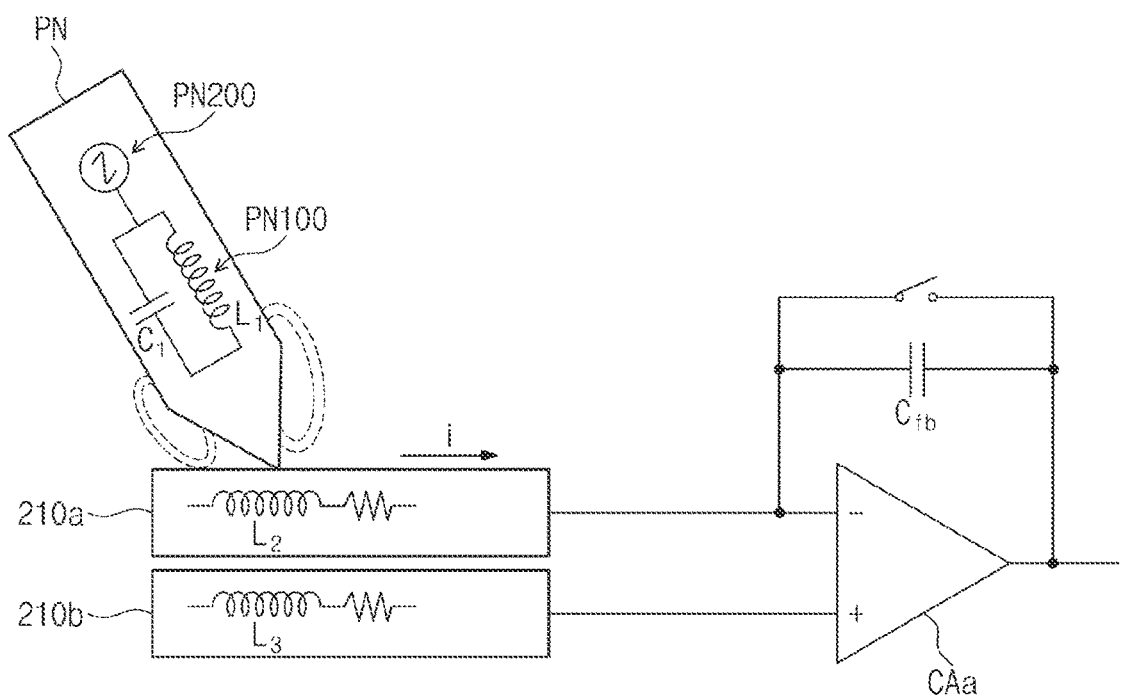
FIG. 13B is a diagram illustrating a method of sensing an input by an electronic device by an electronic pen according to an embodiment of the inventive concept.

FIG. 13B is a diagram illustrating a method of sensing an input by an electronic device by an electronic pen according to an embodiment of the inventive concept.

In FIG. 13B, two electrodes 210a and 210b of the electrodes 210 illustrated in FIG. 5 and a charge amplifier CAa connected to the two electrodes 210a and 210b are illustrated. The two electrodes 210a and 210b may be closest to each other. One electrode 210a may be electrically connected to the inverting input of the charge amplifier CAa, and the other electrode 210b may be electrically connected to the non-inverting input of the charge amplifier CAa.

According to an embodiment of the inventive concept, the electronic device ED (see FIG. 6) that does not include a separate digitizer is configured to detect not only a user's touch but also an input by the electronic pen PN using the sensor layer ISL (see FIG. 3B). That is, by using the sensor layer ISL (see FIG. 3A) and the touch driving chip T-IC (see FIG. 4), which detect a touch due to a change in mutual capacitance, an input by the electronic pen PN that provides an output signal based on an electromagnetic resonance method may also be detected.

FIGS. 14A, 14B, 15A, and 15B are diagrams for explaining an operation of detecting a tilt degree of an electronic pen according to an embodiment of the inventive concept.

Figure 14A:
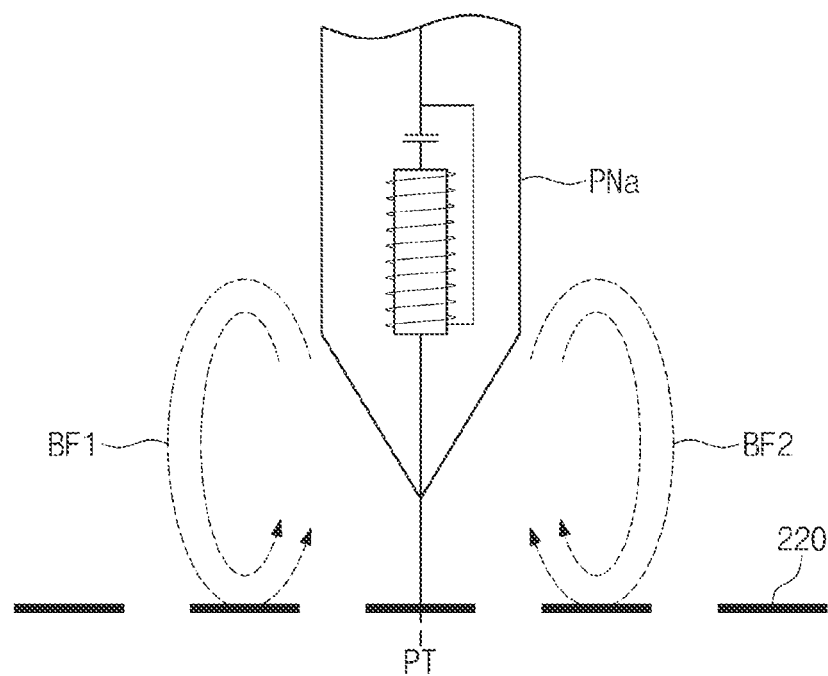
FIGS. 14A, 14B, 15A, and 15B are diagrams for explaining an operation of detecting a tilt degree of an electronic pen according to an embodiment of the inventive concept.
Figure 14B:
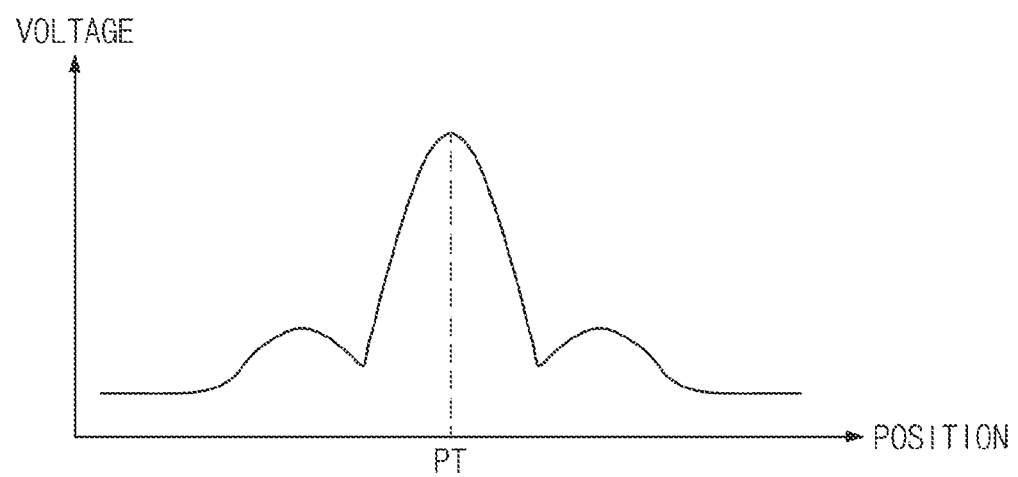

Referring to FIGS. 14A and 14B, in a state in which the electronic pen PNa is not tilted, the magnetic field BF1 on the left side and the magnetic field BF2 on the right side may have a symmetrical shape based on the center point PT of the electronic pen PNa. For example, the electronic pen PNa may be disposed at a right angle with respect to a surface of the display layer DPL when the electronic pen PNa is not tilted. The voltage value detected through the cross electrodes 220 may have a profile as shown in FIG. 14B. That is, when the electronic pen PNa is not tilted, the detected data (e.g., detected voltage value) may have a profile symmetrical with respect to the center point PT. For example, the voltage value may have a maximum peak value at the center point PT, and may have two peak values smaller than the maximum peak value on both sides of the center point PT. The two peak values may be substantially the same.

Figure 15A:
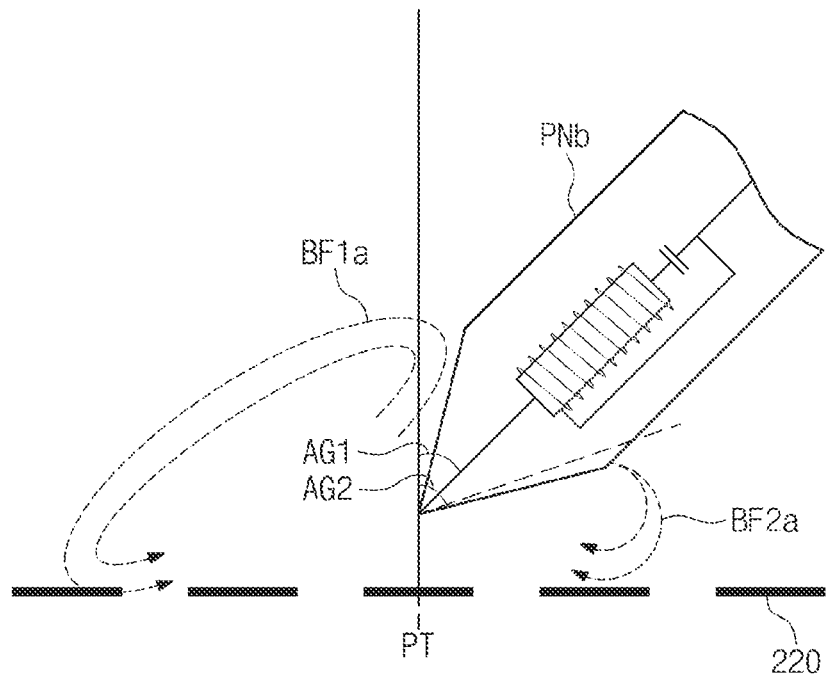
Figure 15B:
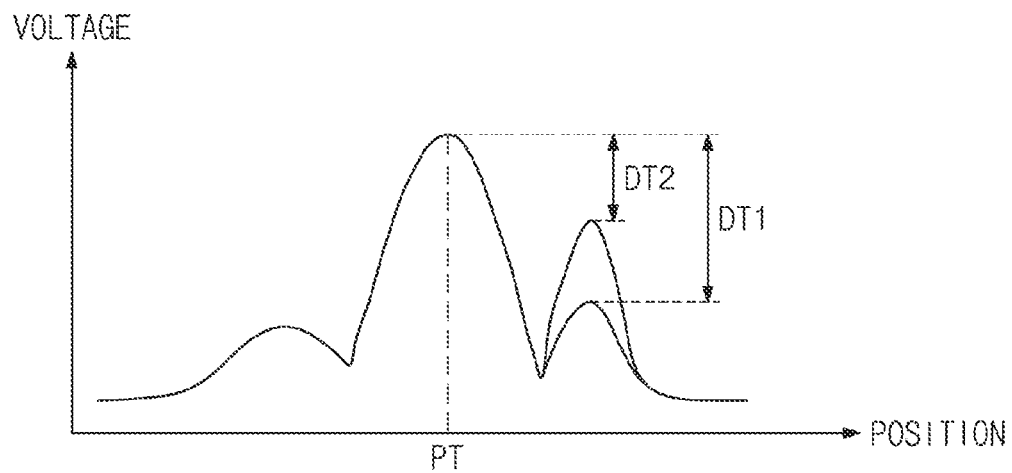

Referring to FIGS. 15A and 15B, when the electronic pen PNb is tilted, the magnetic field BF1 a on the left side and the magnetic field BF2a on the right side may have different shapes based on the center point PT of the electronic pen PNb. When the electronic pen PNb is tilted, it may be orientated at an acute angle with respect to a surface of the display layer DPL.

For example, when the electronic pen PNb is inclined to the right based on the center point PT, a peak value appearing on the right may increase based on the maximum peak value. As the degree of inclination is greater, the peak value may increase further. In FIG. 15B, the first difference DT1 may be a difference between the maximum peak value and the right peak value when the electronic pen PNb is inclined at the first angle AG1, and the second difference DT2 may be a difference between the maximum peak value and the right peak value when the electronic pen PNb is inclined at the second angle AG2. In an embodiment, the second angle AG2 is greater than the first angle AG1, and the second difference DT2 is smaller than the first difference DT1.

When the electronic pen PNb is tilted, the tilt angle of the electronic pen PNb may be determined based on a difference between the maximum peak value and the peak value generated in the inclined direction.

Figure 16A:
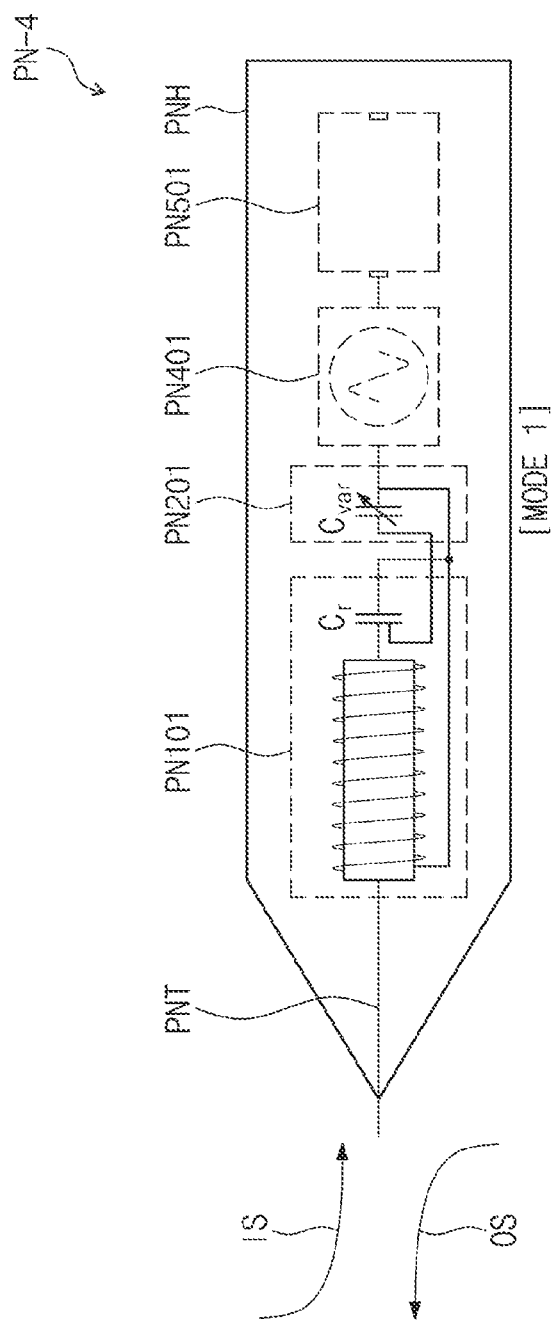
FIG. 16A is a block diagram of an electronic pen according to an embodiment of the inventive concept.
Figure 16B:
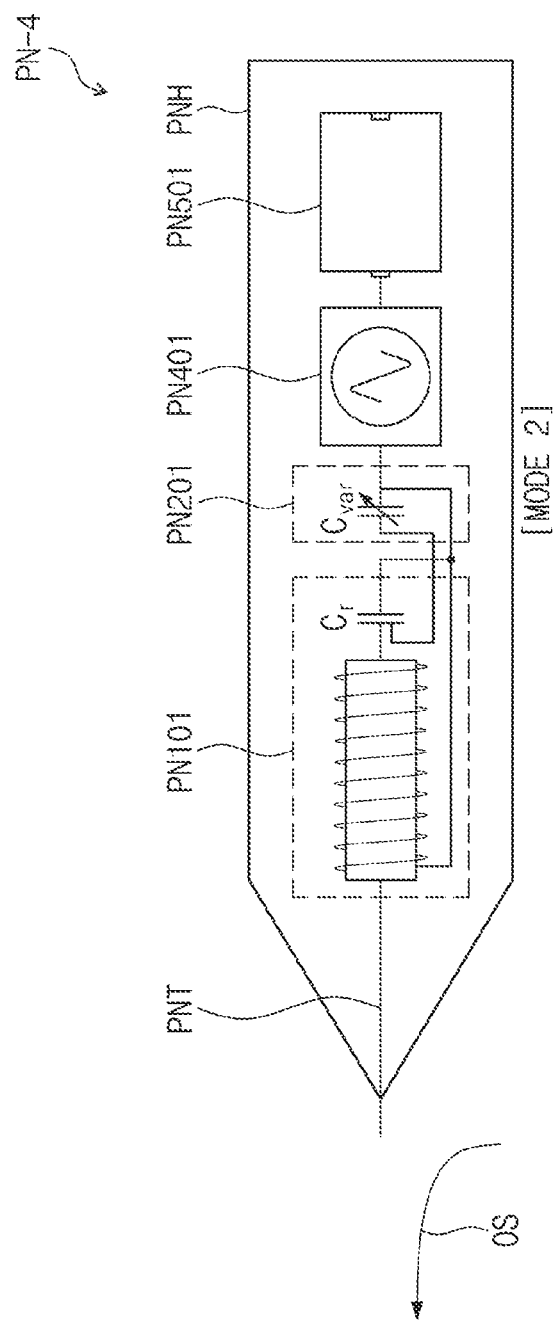
FIG. 16B is a block diagram of an electronic pen according to an embodiment of the inventive concept.
Figure 17:
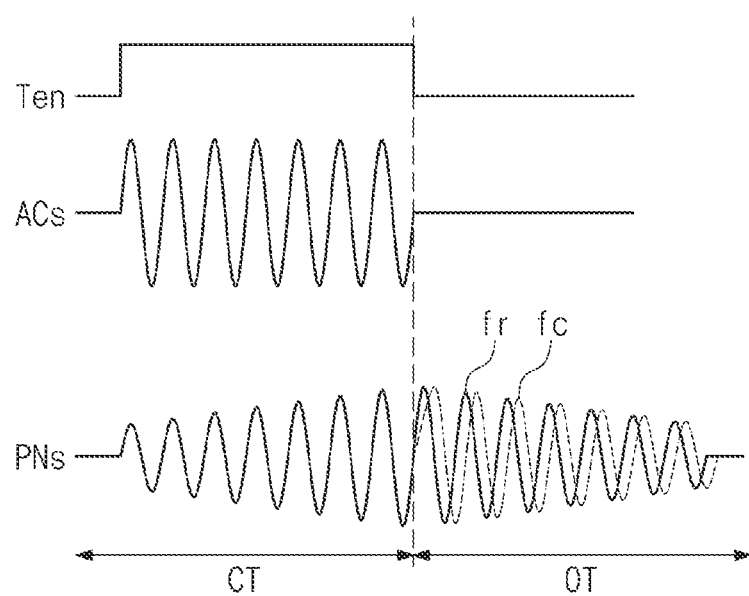
FIG. 17 is a diagram illustrating an enable signal, an AC signal, and an electronic pen signal according to an embodiment of the inventive concept.

FIG. 16A is a block diagram of an electronic pen according to an embodiment of the inventive concept. FIG. 16B is a block diagram of an electronic pen according to an embodiment of the inventive concept. FIG. 17 is a diagram illustrating an enable signal, an AC signal, and an electronic pen signal according to an embodiment of the inventive concept.

FIG. 16A is a diagram illustrating an electronic pen PN-4 operating in a first mode (or a passive mode), and FIG. 16B is a diagram illustrating an electronic pen PN-4 operating in a second mode (or an active mode).

Referring to FIGS. 16A and 17, the electronic pen PN-4 includes a housing PNH, a pen tip PNT, a resonance circuit PN101, a pen pressure detector PN201, a signal generator PN401, and a power supply PN501.

When the electronic pen PN-4 is used in the electronic device ED (see FIG. 6) including the digitizer DTZ (see FIG. 10A), an external magnetic field IS may be provided to the electronic pen PN-4. The external magnetic field IS may be a magnetic field generated by the digitizer DTZ (refer to FIG. 10A).

When the external magnetic field IS is received by the electronic pen PN-4, the signal generator PN401 and the power supply PN501 may stop operating. That is, the electronic pen PN-4 may be operated in a passive type.

As shown in FIG. 17, during the section CT in which the enable signal Ten is activated, the AC signals ACs may be provided to the digitizer DTZ (refer to FIG. 10A). The enable signal Ten and the AC signals ACs may be generated by a driving chip driving the digitizer DTZ.

The resonance circuit PN101 may be charged by the current during the section CT in which the enable signal Ten is activated, and then discharge the charged current during the output section OT of FIG. 17. That is, the resonance circuit PN101 may emit a magnetic field OS having a resonance frequency during the output section OT.

The electronic pen signal PNs shown in FIG. 17 refers to a waveform of a magnetic field. During the output section OT, the resonance circuit PN101 may emit a magnetic field having a resonance frequency fr. When physical pressure is applied to the electronic pen PN-4 (e.g., to the pen tip PNT), the capacitance of the variable capacitor may be changed. As a result, the resonance frequency fc of the magnetic field outputted from the resonance circuit PN101 may be changed.

The resonance frequency fr or fc of the output magnetic field may be expressed by the following Equation 1.

$$\frac{1}{2\pi\sqrt{L(Cr + C\text{var})}} \qquad [\text{Equation 1}]$$

where L is the inductance of the resonance circuit PN101, Cr is the capacitance of the resonance circuit PN101, and $C_{var}$ is the capacitance of the pen pressure detector PN201.

Referring to FIG. 16B and FIG. 17, when the electronic pen PN-4 is used in the electronic device ED (see FIG. 6) that does not include a digitizer, the electronic pen PN-4 may be operated in a second mode (or active type).

AC signals ACs may be provided to the resonance circuit PN101 during the section CT in which the enable signal Ten is activated. The enable signal Ten and the AC signal ACs may be generated by the signal generator PN401. That is, the resonance circuit PN101 may be charged by a configuration included in the electronic pen PN-4.

The resonance circuit PN101 may be charged by the current during the section CT in which the enable signal Ten is activated, and then discharge the charged current during the output section OT. That is, the resonance circuit PN101 may emit a magnetic field OS having a resonance frequency.

The frequency of the AC signals ACs generated by the signal generator PN401 may have a predetermined value, for example, a fixed value. That is, what changes according to the pressure is not the frequency of the AC signals ACs generated by the signal generator PN401, but the resonance frequency of the output signal OS.

The electronic pen PN-4 according to an embodiment of the inventive concept may include a signal generator PN401 that generates AC power therein. In this case, the electronic pen PN may generate an induced current by the internal signal generator PN401 even if there is no external magnetic field provided from the outside. Accordingly, even if the electronic device ED (see FIG. 6) does not include a digitizer that forms a magnetic field, the electronic device ED may detect an input of the electronic pen PN that outputs the magnetic field.

The electronic pen PN-4 may be operated by selecting one of an active type or a passive type according to whether the electronic device ED (refer to FIG. 6) includes a digitizer. Accordingly, an electronic pen with increased performance that may be used in various environments may be provided.

Figure 18:
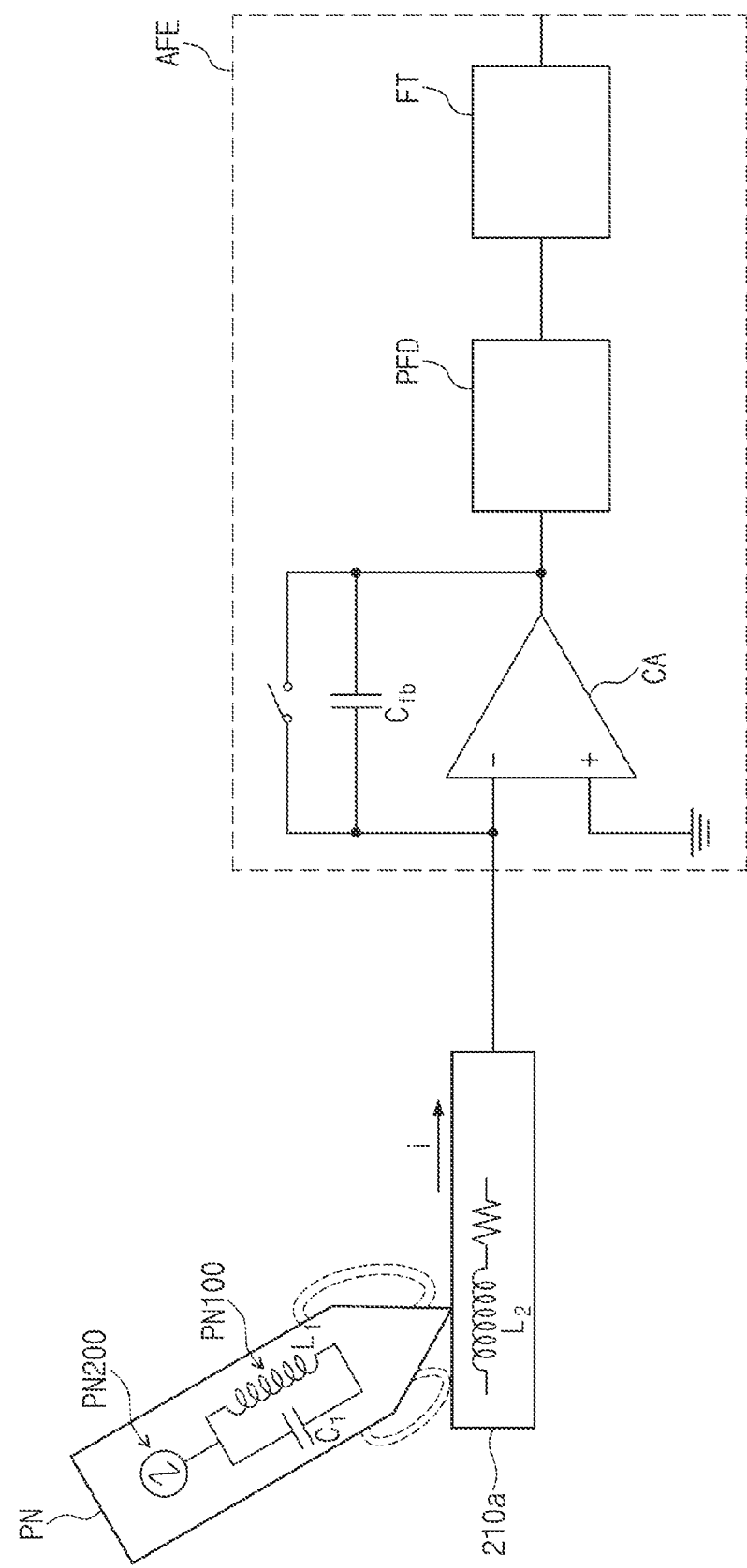
FIG. 18 is a diagram illustrating a method of sensing an input by an electronic device by an electronic pen according to an embodiment of the inventive concept.

FIG. 18 is a diagram illustrating a method of sensing an input by an electronic device by an electronic pen according to an embodiment of the inventive concept.

Referring to FIGS. 5A and 18, the touch driving chip T-IC may include an analog front end AFE. The charge amplifiers CA or CAa of FIGS. 13A and 13B may be components included in the analog front end AFE. Only a configuration having a connection structure similar to that of FIG. 13A is described with reference to FIG. 18, but the description of FIG. 18 may also be applied to the configuration of FIG. 13B (e.g., a structure in which the electrode 210b (see FIG. 13B) adjacent to a non-inverting input terminal is electrically connected).

The analog front end AFE may include a charge amplifier CA, a change detection unit PFD, and a filter FT. The change detection unit PFD may be configured as a circuit capable of detecting a change in a phase and/or a frequency of an input signal. For example, the change detection unit PFD may be implemented by a phase and/or frequency detector. The change detection unit PFD may detect the pen pressure through a phase and/or frequency change of the input signal. The filter FT may serve to remove noise included in a signal outputted from the charge amplifier CA.

As described above, the electronic pen may include a signal generator that generates AC power therein. In this case, in the electronic pen, even if there is no external magnetic field provided from the outside, induced current may be generated by the internal signal generator. Accordingly, even if the electronic device does not include a digitizer that generates a magnetic field, the electronic device may detect an input of the electronic pen that outputs the magnetic field. In addition, the electronic pen may be operated by selecting one of an active type or a passive type according to whether or not the electronic device includes a digitizer. Accordingly, an electronic pen with increased performance that may be used in various environments may be provided.

Although various embodiments of the present invention have been described above, it is to be understood that the present invention should not be limited to these embodiments since various changes and modifications can be made by one of ordinary skill in the art within the spirit and scope of the present invention as hereinafter claimed.

What is claimed is:

1. An electronic pen comprising:
a signal generator configured to generate an enable signal and an alternating current (AC) signal;
a power supply configured to supply power to the signal generator; and
a resonance circuit configured to be charged by a current from the AC signal generated by the signal generator when the enable signal is activated and emit an electromagnetic field based on the current when the enable signal is deactivated.

2. The electronic pen of claim 1, wherein the resonance circuit is charged with the current during a period in which the enable signal is activated.

3. The electronic pen of claim 2, wherein, a frequency of the AC signal has a predetermined value, and a resonance frequency of an output signal outputted from the resonance circuit is changed.

4. The electronic pen of claim 3, further comprising:
a pen tip; and
a pressure detector electrically connected to the resonance circuit and configured to detect physical pressure applied to the pen tip,
wherein the pressure detector comprises a variable capacitor.

5. The electronic pen of claim 4, wherein the resonance frequency of the output signal is changed according to the detected physical pressure.

6. The electronic pen of claim 1, further comprising:
a signal detector for detecting an external magnetic field provided from outside of the electronic pen;
wherein the signal detector controls a transmission of the AC signal according to whether the external magnetic field is detected.

7. The electronic pen of claim 6, wherein, when the external magnetic field is detected, the resonance circuit operates as a passive type charged by the external magnetic field.

8. The electronic pen of claim 6, wherein, when the external magnetic field is not detected, the resonance circuit operates as an active type charged by the AC signal provided by the signal generator.

9. The electronic pen of claim 1, wherein the enable signal has a first level and a second level different from the first level.

10. The electronic pen of claim 9, wherein, when the enable signal is at the first level, the AC signal is provided to the resonance circuit, and wherein, when the enable signal is at the second level, the resonant circuit emits the electromagnetic field.

11. An electronic device comprising:
a display layer;
a sensor layer disposed on the display layer, and comprising first electrodes and second electrodes; and
a touch driver configured to drive the sensor layer,
wherein, when an input device provides an output signal based on an electromagnetic resonance method and the input device approaches the sensor layer, an induced current flows in at least one electrode among the first electrodes and the second electrodes, and
wherein the touch driver generates a voltage signal based on the induced current,
wherein the touch driver comprises:
a charge amplifier, wherein a first input of the charge amplifier is electrically connected to the at least one electrode; and
a capacitor connected to the first input of the charge amplifier and an output of the charge amplifier, and wherein the capacitor receives the induced current and outputs the voltage signal based on the induced current.

12. The electronic device of claim 11, wherein a reference potential is provided to a second input of the charge amplifier.

13. The electronic device of claim 11, wherein another one of the first electrodes and the second electrode is electrically connected to a second input of the charge amplifier.

14. The electronic device of claim 11, wherein the touch driver further comprises a change detector detecting at least one of a phase change and a frequency change of a signal outputted from the charge amplifier.

15. The electronic device of claim 11, wherein the touch driver further comprises a filter configured to remove noise included in a signal outputted from the charge amplifier.

16. The electronic device of claim 11, wherein the touch driver is configured to detect an input by a user's touch based on a change in mutual capacitance between the first electrodes and the second electrodes.

17. The electronic device of claim 11, wherein the touch driver is configured to detect an input by the input device using the first electrodes or the second electrodes.

18. The electronic device of claim 11 does not include a digitizer.

* * * * *